(12) United States Patent
Tei et al.

(10) Patent No.: US 11,264,773 B2
(45) Date of Patent: Mar. 1, 2022

(54) LASER APPARATUS AND METHOD FOR MANUFACTURING OPTICAL ELEMENT

(71) Applicant: Gigaphoton Inc., Tochigi (JP)

(72) Inventors: Daisuke Tei, Oyama (JP); Osamu Wakabayashi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 70 days.

(21) Appl. No.: 16/674,994

(22) Filed: Nov. 5, 2019

(65) Prior Publication Data

US 2020/0067257 A1 Feb. 27, 2020

Related U.S. Application Data

(63) Continuation of application No. PCT/JP2017/021758, filed on Jun. 13, 2017.

(51) Int. Cl.
*H01S 3/034* (2006.01)
*H01S 3/081* (2006.01)
(Continued)

(52) U.S. Cl.
CPC .......... *H01S 3/0813* (2013.01); *C30B 29/12* (2013.01); *G02B 1/02* (2013.01); *G02B 27/108* (2013.01);
(Continued)

(58) Field of Classification Search
None
See application file for complete search history.

(56) References Cited

U.S. PATENT DOCUMENTS

| 6,181,724 B1 | 1/2001 | Tanaka et al. |
| 2003/0011896 A1* | 1/2003 | Shiraishi ............. G03F 7/70966 359/754 |

(Continued)

FOREIGN PATENT DOCUMENTS

| JP | H11-177173 A | 7/1999 |
| JP | 2003-249708 A | 9/2003 |

(Continued)

OTHER PUBLICATIONS

International Search Report issued in PCT/JP2017/021758; dated Sep. 5, 2017.

(Continued)

*Primary Examiner* — Tod T Van Roy
(74) *Attorney, Agent, or Firm* — Studebaker & Brackett PC

(57) ABSTRACT

A laser apparatus including an optical element made of a $CaF_2$ crystal and configured to transmit an ultraviolet laser beam obliquely incident on one surface of the optical element, the electric field axis of the P-polarized component of the laser beam propagating through the optical element coinciding with one axis contained in <111> of the $CaF_2$ crystal, with the P-polarized component defined with respect to the one surface. A method for manufacturing an optical element, the method including causing a seed $CaF_2$ crystal to undergo crystal growth along one axis contained in <111> to form an ingot, setting a cutting axis to be an axis inclining by an angle within 14.18±5° with respect to the crystal growth direction toward the direction of another axis contained in <111>, which differs from the crystal growth direction, and cutting the ingot along a plane perpendicular to the cutting axis.

17 Claims, 17 Drawing Sheets

(51) Int. Cl.
*C30B 29/12* (2006.01)
*G02B 1/02* (2006.01)
*G02B 27/12* (2006.01)
*G03F 7/20* (2006.01)
*H01S 3/08* (2006.01)
*H01S 3/13* (2006.01)
*H01S 3/22* (2006.01)
*H01S 3/225* (2006.01)
*G02B 27/10* (2006.01)

(52) U.S. Cl.
CPC ....... *G02B 27/126* (2013.01); *G03F 7/70025* (2013.01); *H01S 3/034* (2013.01); *H01S 3/0346* (2013.01); *H01S 3/08059* (2013.01); *H01S 3/1305* (2013.01); *H01S 3/2222* (2013.01); *H01S 3/2251* (2013.01)

(56) References Cited

U.S. PATENT DOCUMENTS

| | | | |
|---|---|---|---|
| 2003/0219056 A1* | 11/2003 | Yager | G03F 7/70041 372/57 |
| 2004/0089023 A1 | 5/2004 | Hiraiwa et al. | |
| 2004/0150878 A1* | 8/2004 | Omura | G03F 7/70241 359/356 |
| 2004/0223212 A1* | 11/2004 | Sakuma | G02B 5/3091 359/355 |
| 2006/0114957 A1 | 6/2006 | Algots et al. | |
| 2008/0094701 A1 | 4/2008 | Natura et al. | |
| 2010/0054297 A1* | 3/2010 | Wakabayashi | G02B 1/02 372/103 |
| 2010/0108913 A1* | 5/2010 | Ershov | H01S 3/225 250/492.1 |
| 2011/0158281 A1 | 6/2011 | Nagai et al. | |
| 2013/0208744 A1 | 8/2013 | Kumazaki et al. | |
| 2013/0235893 A1* | 9/2013 | Kumazaki | H01S 3/034 372/55 |

FOREIGN PATENT DOCUMENTS

| | | |
|---|---|---|
| JP | 2006-073921 A | 3/2006 |
| JP | 2007-047502 A | 2/2007 |
| JP | 2008-116940 A | 5/2008 |
| JP | 2008522439 A | 6/2008 |
| JP | 2013-168473 A | 8/2013 |
| JP | 2014-225700 A | 12/2014 |
| WO | 03009017 A1 | 1/2003 |

OTHER PUBLICATIONS

International Preliminary Report on Patentability and Written Opinion issued in PCT/JP2017/021758; dated Dec. 17, 2019.

* cited by examiner

US 11,264,773 B2

LASER APPARATUS AND METHOD FOR MANUFACTURING OPTICAL ELEMENT

CROSS-REFERENCE TO RELATED APPLICATIONS

The present application is a continuation application of International Application No. PCT/JP2017/021758 filed on Jun. 13, 2017. The content of the application is incorporated herein by reference in its entirety.

BACKGROUND

1. Technical Field

The present disclosure relates to a laser apparatus and a method for manufacturing an optical element.

2. Related Art

A semiconductor exposure apparatus is required to improve the resolution as a semiconductor integrated circuit is increasingly miniaturized and highly integrated. A semiconductor exposure apparatus will be hereinafter simply referred to as an "exposure apparatus." To improve the resolution of an exposure apparatus, reduction in the wavelength of the light emitted from a light source for exposure is underway. A gas laser apparatus is used as the light source for exposure in place of a mercury lamp in related art. At present, a KrF excimer laser apparatus, which emits ultraviolet light having a wavelength of 248 nm, and an ArF excimer laser apparatus, which emits ultraviolet light having a wavelength of 193.4 nm, are used as a laser apparatus for exposure.

As a current exposure technology, liquid-immersion exposure, in which the gap between the exposure lens of the exposure apparatus and a wafer is filled with a liquid, has been put into use. In the liquid-immersion exposure, since the refractive index of the gap changes, the apparent wavelength of the light from the light source for exposure is shortened. In the liquid-immersion exposure with an ArF excimer laser apparatus as the light source for exposure, the wafer is irradiated with ultraviolet light having a wavelength of 134 nm in water. The technology described above is called ArF liquid-immersion exposure. The ArF liquid-immersion exposure is also called ArF liquid-immersion lithography.

Since KrF and ArF excimer laser apparatuses each have a wide spectral linewidth ranging from about 350 to 400 pm in spontaneous oscillation, the chromatic aberrations occur in association with the laser light (ultraviolet light) projected with the size thereof reduced onto the wafer via the projection lens of the exposure apparatus, resulting in a decrease in the resolution. To avoid the decrease in the resolution, the spectral linewidth of the laser light emitted from the gas laser apparatus needs to be narrow enough to make the chromatic aberrations negligible. A line narrowing module including a line narrowing element is therefore provided in the laser resonator of the gas laser apparatus. The line narrowing module narrows the spectral linewidth. The line narrowing element may, for example, be an etalon or a grating. A laser apparatus having a narrowed spectral linewidth described above is called a narrowed-linewidth laser apparatus.

CITATION LIST

Patent Literature

[PTL 1] JP-A-2003-249708
[PTL 2] JP-A-2013-168473
[PTL 3] JP-A-2008-522439
[PTL 4] JP-A-2007-047502

SUMMARY

A laser apparatus according to a viewpoint of the present disclosure includes
an optical element that is made of a $CaF_2$ crystal and configured to transmit an ultraviolet laser beam obliquely incident on one surface of the optical element, an electric field axis of a P-polarized component of the laser beam propagating through an interior of the optical element coinciding with one axis contained in <111> of the $CaF_2$ crystal, with the P-polarized component defined with respect to the one surface of the optical element.

A laser apparatus according to another viewpoint of the present disclosure includes
an optical element that is made of a $CaF_2$ crystal and configured to transmit an ultraviolet laser beam incident on one surface of the optical element, an electric field axis of a maximum-amount polarized component of the laser beam propagating through an interior of the optical element coinciding with one axis contained in <111> of the $CaF_2$ crystal.

A method for manufacturing an optical element according to another viewpoint of the present disclosure includes
causing a seed $CaF_2$ crystal to undergo crystal growth along one axis contained in <111> to form an ingot, setting a cutting axis to be an axis inclining by an angle smaller than or equal to $14.18\pm5°$ with respect to the crystal growth direction toward a direction of another axis contained in <111>, which differs from the crystal growth direction, and cutting the ingot along a plane perpendicular to the cutting axis.

BRIEF DESCRIPTION OF THE DRAWINGS

Embodiments of the present disclosure will be described below only by way of example with reference to the accompanying drawings.

DETAILED DESCRIPTION

Contents

Figure 1:
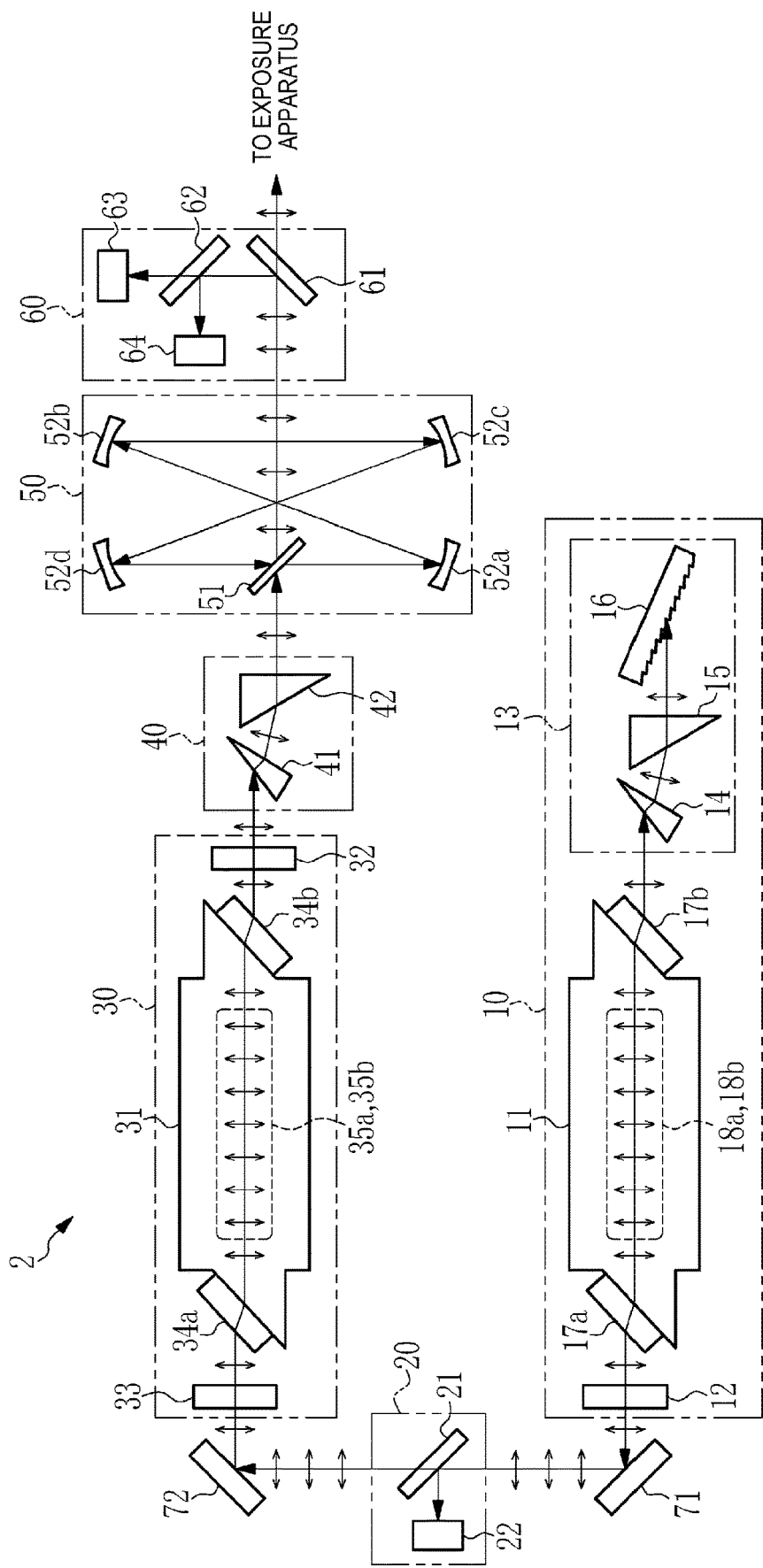
FIG. 1 schematically shows the configuration of a laser apparatus 2 according to Comparative Example.

1. Comparative Example
1.1 Laser apparatus
1.1.1 Configuration
1.1.2 Operation
1.2 Windows
1.2.1 Configuration and effects
1.3 Problems
2. Definitions of terms
2.1 Crystal plane and axis
2.2 Cutting plane and cutting axis
2.3 Electric field axis
3. First Embodiment
3.1 Configuration and effects
3.2 Advantages
4. Second Embodiment
4.1 Configuration and effects
4.2 Method for manufacturing optical element
4.3 Advantages
5. Third Embodiment
5.1 Configuration and effects
5.2 Advantages
6. Fourth Embodiment
6.1 Configuration and effects
6.2 Advantages
7. Fifth Embodiment
7.1 Configuration and effects
7.2 Advantages
8. Sixth Embodiment
8.1 Configuration
8.2 Effects
8.3 Advantages
9. Seventh Embodiment
9.1 Configuration and effects
9.2 Advantages Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. Comparative Example 1.1 Laser Apparatus
1.1.1 Configuration

FIG. 1 shows an overall configuration of a laser apparatus 2. The laser apparatus 2 is an excimer laser apparatus for an exposure apparatus configured as a two-stage laser apparatus. The laser apparatus 2 includes a master oscillator 10, a power monitor 20, a power oscillator 30, a beam expander module 40, an optical pulse stretcher 50, a monitor module 60, a first high-reflectance mirror 71, and a second high-reflectance mirror 72.

The master oscillator 10 includes a chamber 11, an output coupling mirror 12, and a line narrowing module 13. The output coupling mirror 12 and the line narrowing module 13 form an optical resonator. The chamber 11 is disposed in the optical path of the optical resonator formed of the output coupling mirror 12 and the line narrowing module 13. The output coupling mirror 12 is a partial reflection mirror formed of a plane-parallel substrate made of a calcium fluoride ($CaF_2$) crystal and having one surface on which a reflection suppressing film is formed and another surface on which a partial reflection film is formed. The reflectance provided by the output coupling mirror 12 ranges, for example, from 20% to 30%.

The line narrowing module 13 includes a first prism 14, a second prism 15, and a grating 16. The first prism 14 and the second prism 15 are so disposed that a laser beam outputted from the chamber 11 is incident on the grating 16 with the diameter of the laser beam enlarged. The grating 16 is disposed in the Littrow arrangement, which causes the angle of incidence of the laser beam incident on the grating 16 to be equal to the angle of diffraction thereof diffracted by the grating 16. The first prism 14 and the second prism 15 are each a right angle prism made of the $CaF_2$ crystal. A reflection suppressing film configured to suppress reflection of light incident at an angle of incidence ranging from 70° to 74° is formed on the inclining surface of each of the first prism 14 and the second prism 15, and another reflection suppressing film configured to suppress reflection of light incident at an angle of incidence of 0° is formed on each of the surfaces that intersect each other at right angles.

The chamber 11 includes a first window 17a, a second window 17b, a first discharge electrode 18a, and a second discharge electrode 18b. A laser gas containing an Ar gas, a fluorine gas, and a Ne gas is encapsulated in the chamber 11. The first discharge electrode 18a and the second discharge electrode 18b are so disposed as to face each other in the direction perpendicular to the plane containing the plane of view in such a way that the optical path of the laser beam passes through the discharge space between the first discharge electrode 18a and the second discharge electrode 18b. The laser beam outputted from the chamber 11 is a pulsed laser beam and is, for example, ultraviolet light having a wavelength of about 193.4 nm.

The first window 17a and the second window 17b are parallel to each other and so disposed that the optical path of the laser beam passes through the first window 17a and the second window 17b. The first window 17a and the second window 17b are further so disposed that the laser beam is incident thereon at an angle of incidence close to Brewster's angle, for example, 56.34±5°. The first window 17a and the second window 17b are each a plane-parallel substrate made of the $CaF_2$ crystal, and the surface of each of the first window 17a and the second window 17b may be coated with a protection film. Further, the first window 17a and the second window 17b are so disposed that the laser beam is P-polarized with respect to the windows.

The first high-reflectance mirror 71 and the second high-reflectance mirror 72 are so disposed as to reflect the laser beam outputted from the master oscillator 10 and guide the reflected laser beam to the power monitor 20. The power monitor 20 is disposed in the optical path of the laser beam between the first high-reflectance mirror 71 and the second high-reflectance mirror 72.

The power monitor 20 includes a beam splitter 21 and an energy sensor 22. The beam splitter 21 is a plane-parallel substrate made of the $CaF_2$ crystal and is so disposed that the laser beam is incident thereon at an angle of incidence of 45°. The energy sensor 22 is disposed in a position where the laser beam reflected off the beam splitter 21 is incident thereon. The energy sensor 22 is a sensor configured to detect the pulse energy of the reflected laser beam and is, for example, a photodiode configured to detect the optical intensity of ultraviolet light.

The power oscillator 30 includes a chamber 31, an output coupling mirror 32, and a rear mirror 33. The output coupling mirror 32 and the rear mirror 33 form an optical resonator. The chamber 31 is disposed in the optical path of the optical resonator formed of the output coupling mirror 32 and the rear mirror 33. The output coupling mirror 32 is a partial reflection mirror formed of a plane-parallel substrate made of the $CaF_2$ crystal and having one surface on which a reflection suppressing film is formed and another surface on which a partial reflection film is formed. The reflectance provided by the output coupling mirror 32 ranges, for example, from 10% to 20%. The rear mirror 33 is a partial reflection mirror formed of a plane-parallel substrate made of the $CaF_2$ crystal and having one surface on which a reflection suppressing film is formed and another surface on which a partial reflection film is formed. The reflectance provided by the rear mirror 33 ranges, for example, from 80% to 90%.

The chamber 31 includes a first window 34a, a second window 34b, a first discharge electrode 35a, and a second discharge electrode 35b. The laser gas containing an Ar gas, a fluorine gas, and a Ne gas is encapsulated in the chamber 31. The first discharge electrode 35a and the second discharge electrode 35b are so disposed as to face each other in the direction perpendicular to the plane containing the plane of view in such a way that the optical path of the laser beam passes through the discharge space between the first discharge electrode 35a and the second discharge electrode 35b.

The first window 34a and the second window 34b are parallel to each other and so disposed that the optical path of the laser beam passes through the first window 34a and the second window 34b. The first window 34a and the second window 34b are further so disposed that the laser beam is incident thereon at an angle of incidence close to Brewster's angle, for example, 56.34±5°. The first window 34a and the second window 34b are each a plane-parallel substrate made of the $CaF_2$ crystal, and the surface of each of the first window 34a and the second window 34b may be coated with a protection film. Further, the first window 34a and the second window 34b are so disposed that the laser beam is P-polarized with respect to the windows.

The beam expander module 40 includes a first prism 41 and a second prism 42. The first prism 41 and the second prism 42 are so disposed as to guide the laser beam outputted from the chamber 31 to the optical pulse stretcher 50 with the diameter of the laser beam enlarged. The first prism 41 and the second prism 42 are each a right angle prism made of the $CaF_2$ crystal. A reflection suppressing film configured to suppress reflection of the P-polarized laser beam incident at an angle of incidence ranging from 54° to 56° is formed on the inclining surface of each of the first prism 42 and the second prism 42, and another reflection suppressing film configured to suppress reflection of the laser beam incident at an angle of incidence of 0° is formed on each of the surfaces that intersect each other at right angles. The first prism 41 and the second prism 42 are so disposed that the laser beam is P-polarized with respect to the inclining surface of each of the prisms.

The optical pulse stretcher 50 is disposed in the optical path of the laser beam outputted from the beam expander module 40. The optical pulse stretcher 50 includes a beam splitter 51 and first to fourth concave mirrors 52a to 52d. The beam splitter 51 is disposed in the optical path of the laser beam outputted from the beam expander module 40 and is so disposed that the laser beam is incident on the beam splitter 51 at an angle of incidence of 45°. The beam splitter 51 is a plane-parallel substrate made of the $CaF_2$ crystal and having one surface on which a partial reflection film is formed and another surface on which a reflection suppressing film is formed. The reflectance provided by the partial reflection film ranges, for example, from 40% to 70%.

The first to fourth concave mirrors 52a to 52d form a delay optical path configured to cause the laser beam partially reflected off the beam splitter 51 to travel along the entire optical path formed by the first to fourth concave mirrors 52a to 52d and be incident again on the beam splitter 51. The first and second concave mirrors 52a, 52b are so disposed as to form an optical image of the reflected light in the position of the beam splitter 51 as a first transferred image having the size equal to the size of the optical image. The third concave mirror 52c and the fourth concave mirror 52d are so disposed as to transfer the first transferred image as a second transferred image having the size equal to the size of the first transferred image in the position of the beam splitter 51. The optical pulse stretcher 50 outputs the laser beam having an increased pulse width.

The monitor module 60 includes a first beam splitter 61, a second beam splitter 62, an energy sensor 63, and a spectrum detector 64. The first beam splitter 61 is disposed in the optical path of the laser beam outputted from the optical pulse stretcher 50 and so disposed that the laser beam is incident on the first beam splitter 61 at an angle of incidence of about 45°. The second beam splitter 62 is disposed in the optical path of the laser beam reflected off the first beam splitter 61 and so disposed that the laser beam is incident on the second beam splitter 62 at an angle of incidence of about 45°. The first beam splitter 61 and the second beam splitter 62 are each a plane-parallel substrate made of the $CaF_2$ crystal.

The energy sensor 63 is so disposed that the laser beam having passed through the second beam splitter 62 is incident on the energy sensor 63. The energy sensor 63 is a sensor configured to detect the pulse energy of the transmitted laser beam and is, for example, a photodiode configured to detect the optical intensity of ultraviolet light. The spectrum detector 64 is so disposed that the laser beam reflected off the second beam splitter 62 is incident on the spectrum detector 64. The spectrum detector 64 is, for example, a spectrometer including an etalon and an image sensor and detects the wavelength and the spectral linewidth of the laser beam.

1.1.2 Operation

The operation of the laser apparatus 2 according to Comparative Example will next be described. When discharge occurs between the first discharge electrode 18a and the second discharge electrode 18b in the chamber 11 of the master oscillator 10, the laser gas is excited in the discharge space, and ultraviolet light is produced when the excited laser gas returns to the ground state. The ultraviolet light passes through the second window 17b and enters the line narrowing module 13.

The light having entered the line narrowing module 13 is incident on the grating 16 with the diameter of the laser beam enlarged by the first prism 14 and the second prism 15. Part of the diffracted light from the grating 16 passes through the first prism 14 and the second prism 15 again, which narrow the spectral linewidth of the laser beam. The light having undergone the line narrowing operation enters the chamber 11 via the second window 17b, and passes though the discharge space, where the light is amplified, and the amplified light passes through the first window 17a and is incident on the output coupling mirror 12.

Out of the light incident on the output coupling mirror 12, the light reflected off the output coupling mirror 12 enters the chamber 11 again via the first window 17a, and passes through the discharge space, where the light is amplified again. On the other hand, the light having passed through the output coupling mirror 12 is outputted as a pulsed laser beam from the master oscillator 10. The light amplified in the discharge space enters the line narrowing module 13 again, where the light further undergoes the line narrowing operation, and the resultant light then enters the chamber 11 via the second window 17b, where the light is amplified.

The laser beam is outputted from the master oscillator 10 with the linearly polarized component thereof polarized in parallel to the plane containing the plane of view amplified. The reason for this is that out of the light incident on the first and second windows 17a, 17b and the first and second prisms 14, 15, the P-polarized component, the polarization direction of which is parallel to the light incident surface of each of the windows and prisms described above, experiences a small amount of loss. The linearly polarized laser beam having undergone the laser oscillation and line narrowing operation as described above is outputted from the master oscillator 10. In FIG. 1, the polarization direction of the laser beam is indicated by the arrows.

The laser beam outputted from the master oscillator 10 is reflected off the first high-reflectance mirror 71 and enters the power monitor 20. In the power monitor 20, the beam splitter 21 causes part of the laser beam to be incident on the energy sensor 22. The energy sensor 22 detects the pulse energy of the laser beam outputted from the master oscillator 10. The laser beam having passed through the power monitor 20 is reflected off the second high-reflectance mirror 72 and incident as seed light on the rear mirror 33 of the power oscillator 30.

The laser beam having passed through the rear mirror 33 is linearly polarized light having a polarization direction parallel to the plane containing the plane of view. The linearly polarized laser beam passes through the first window 34a and enters the discharge space in the chamber 31. Discharge created between the first discharge electrode 35a and the second discharge electrode 35b in synchronization with the timing at which the laser beam enters the discharge space amplifies the laser beam. The amplified laser beam passes through the second window 34b and is incident on the output coupling mirror 32.

Part of the laser beam incident on the output coupling mirror 32 passes through the output coupling mirror 32 and is outputted from the power oscillator 30. On the other hand, part of the light reflected off the output coupling mirror 32 enters the chamber 31 again via the second window 34b, and passes through the discharge space, where the laser beam is amplified again. The amplified laser beam passes through the first window 34a and is incident again on the rear mirror 33. The laser beam reflected off the rear mirror 33 passes via the first window 34a again through the discharge space in the chamber 31, where the laser beam is amplified. The amplified laser beam passes through the second window 34b and is incident on the output coupling mirror 32. Part of the laser beam is outputted from the output coupling mirror 32, and another part of the laser beam returns again into the optical resonator, whereby amplified oscillation occurs. Since the first window 34a and the second window 34b are so disposed that the seed light is P-polarized light, reflection loss of the laser beam that occurs when the laser beam passes through the windows is suppressed. Further, the laser beam outputted from the output coupling mirror 32 is linearly polarized light having a polarization direction parallel to the plane containing the plane of view.

The laser beam outputted from the power oscillator 30 enters the beam expander module 40, where the first prism 41 and the second prism 42 enlarge the diameter of the laser beam. In this process, the laser beam outputted from the power oscillator 30 is P-polarized light with respect to the inclining surfaces of the first prism 41 and the second prism 42. As a result, reflection loss of the laser beam that occurs when the laser beam passes through the prisms is suppressed. The laser beam outputted from the beam expander module 40 enters the optical pulse stretcher 50.

Part of the laser beam having entered the optical pulse stretcher 50 passes through and exits out of the beam splitter 51, and another part of the laser beam is reflected off the beam splitter 51. The laser light reflected off the beam splitter 51 travels along the entire delay optical path formed of the first to fourth concave mirrors 52a to 52d and is incident again on the beam splitter 51. Part of the laser beam incident on the beam splitter 51 is reflected off the beam splitter 51 and outputted from the optical pulse stretcher 50. The laser beam having passed through the beam splitter 51 travels along the entire delay optical path again. The pulse width of the laser beam is thus increased.

The laser beam having a pulse width increased by the optical pulse stretcher 50 enters the monitor module 60. Part of the laser beam having entered the monitor module 60 is reflected off the first beam splitter 61 and incident on the second beam splitter 62. The laser beam having passed through the second beam splitter 62 is incident on the energy sensor 63, which detects the pulse energy of the laser beam. The laser beam reflected off the second beam splitter 62 is incident on the spectrum detector 64, which detects the wavelength and the spectral linewidth of the laser beam. On the other hand, the laser beam having passed through the first beam splitter 61 is supplied to an exposure apparatus that is not shown.

1.2 Windows

1.2.1 Configuration and Effects

An optical element 80, which forms each of the first and second windows 17a, 17b of the chamber 11 and the first and second windows 34a, 34b of the chamber 31 will next be described.

Figure 2:
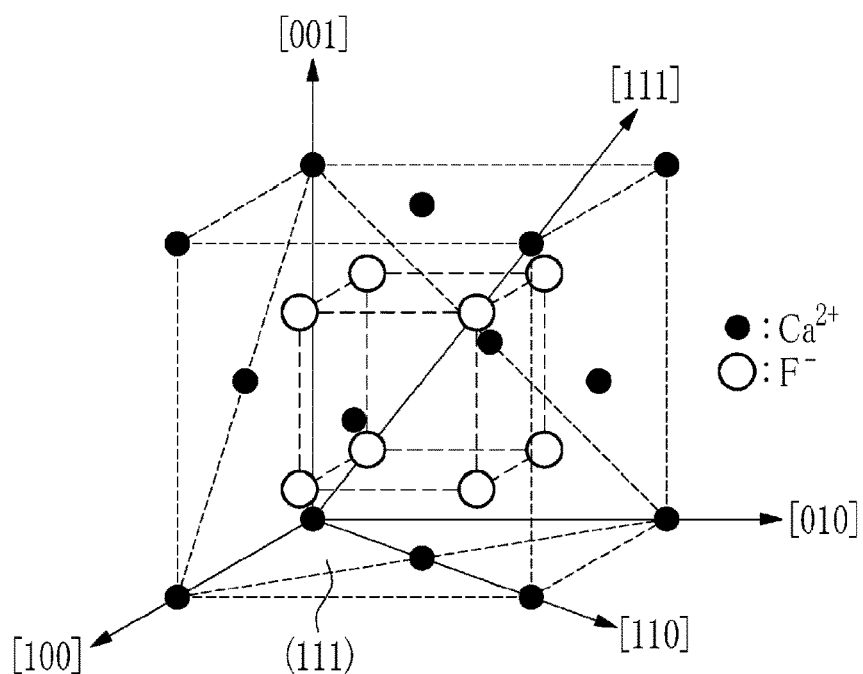
FIG. 2 shows the structure of a $CaF_2$ crystal.

FIG. 2 shows the structure of the CaF$_2$ crystal, of which the optical element 80 is made. The CaF$_2$ crystal is characterized in that the calcium ions (Ca$^{2+}$) form a face-centered cubic lattice structure and the fluorine ions (F$^-$) form a simple cubic lattice structure. The calcium ions are each located at the center of the cube formed of the fluorine ions. The fluorine ions are each located at the center of the regular tetrahedron formed of the calcium ions.

The CaF$_2$ crystal has three-fold symmetry with respect to the axis [111] as the axis of symmetry. That is, when the CaF$_2$ crystal is viewed from the side immediately above the axis [111], the angle between the axis [100] and the axis [010] is 120°, and the angle between the axis [100] and the axis [001] is 240°.

Figure 3:
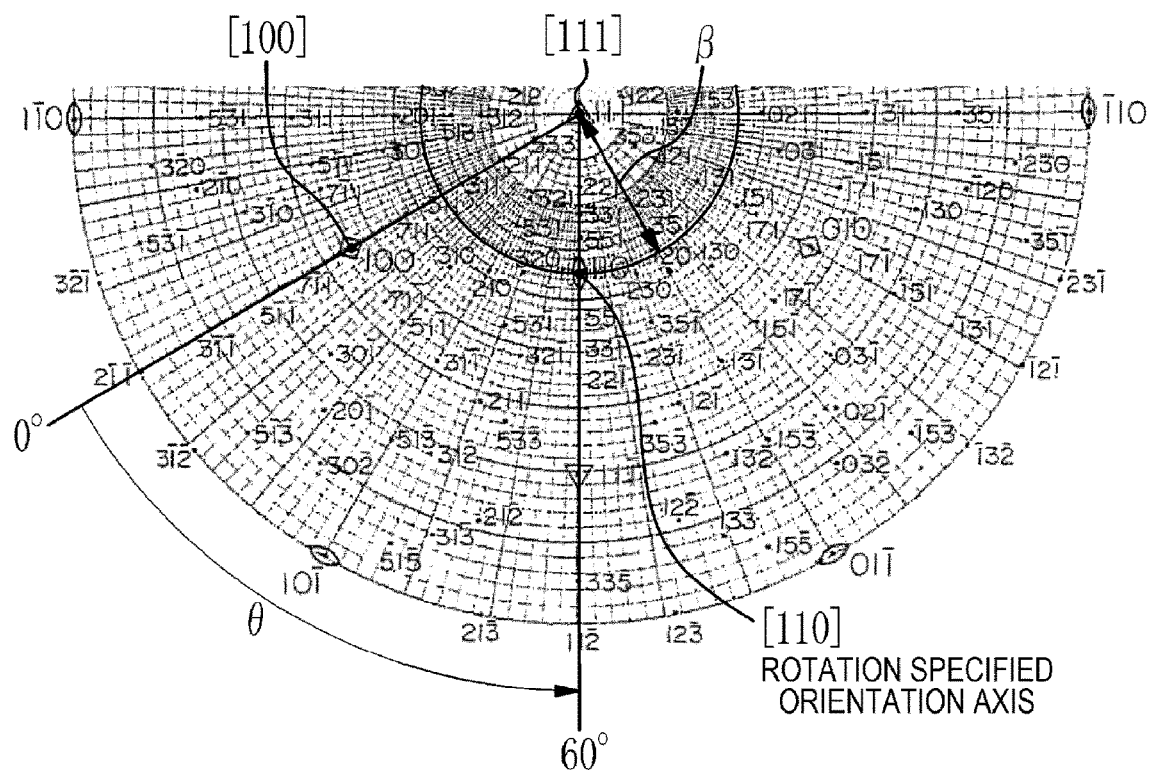
FIG. 3 is a standard (111) projection of a cubic according to Comparative Example.

FIG. 3 partially illustrates a standard (111) projection of a cubic corresponding to the structure of the CaF$_2$ crystal. The axis [100] rotated by an angle θ around the axis [111] is defined as a rotation specified orientation axis, as shown in FIG. 3. It is assumed in Comparative Example that θ=60° and the axis [110] coincides with the rotation specified orientation axis.

Figure 4:
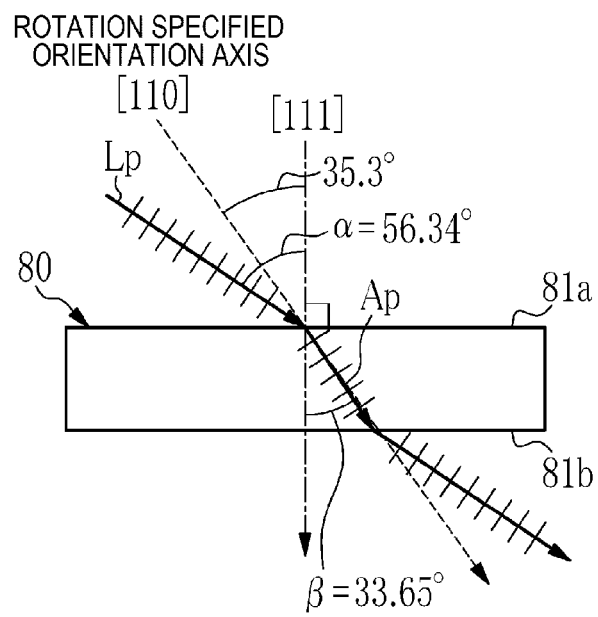
FIG. 4 is a cross-sectional view of an optical element 80 according to Comparative Example.

FIG. 4 is a cross-sectional view of the optical element 80 taken along the plane containing the axis [111] and the rotation specified orientation axis. The optical element 80 is a plane-parallel substrate formed by cutting the CaF$_2$ crystal along the plane (111) in accordance with the crystal orientation. A first flat surface 81a and a second flat surface 81b of the optical element 80, which are parallel to each other, each have the (111)-plane orientation.

The optical element 80 has a light incident surface that is the surface containing the axis [111] and the rotation specified orientation axis and is so disposed that a laser beam Lp is incident as P-polarized light on the first flat surface 81a. The angle of incidence α of the laser beam Lp is roughly equal to Brewster's angle θ$_B$. Assuming that the refractive index n of the CaF$_2$ crystal is 1.501958, Brewster's angle θ$_B$ is calculated to be 56.34° based on the following Expression (1):

$$\theta_B = \arctan(n) \quad (1)$$

The laser beam Lp is refracted at the first flat surface 81a at an angle of refraction β in accordance with Snell's law. In this case, the angle of refraction β is calculated to be 33.65° based on the following Expression (2):

$$\sin \alpha = n \cdot \sin \beta \quad (2)$$

The laser beam Lp having entered the optical element 80 via the first flat surface 81a propagates along an optical path axis Ap as the axis of refraction. When the laser beam Lp propagates through the interior of the optical element 80 and reaches the second flat surface 81b, the laser beam Lp is refracted at the second flat surface 81b in accordance with Snell's law and outputted as linearly P-polarized light with respect to the optical element 80.

The CaF$_2$ crystal undergoes crystal growth along the axis [111] and has a cleavable plane (111). An optical element 80 so configured that the first flat surface 81a and the second flat surface 81b are each the (111) plane can therefore be readily manufactured. Further, since a surface that coincides with the plane (111) is harder than the other crystal planes, the surface roughness can be reduced. Moreover, a configuration in which the optical element 80 is so oriented that the axis [100] is rotated by 60° around the axis [111] advantageously allows a decrease in thermal stress with respect to the same amount of heat generated by the laser beam, as compared with a case where the optical element 80 is otherwise oriented excluding orientations equivalent to the orientation described above.

1.3 Problems

Problems with the laser apparatus 2 according to Comparative Example will next be described. As the power of a laser beam has been increased in recent years, the arrangement of the optical element 80 as shown in FIG. 4 still causes the following problems: When the power of the laser beam Lp passing through the optical element 80 increases, the amount of laser beam Lp absorbed by the optical element 80 increases accordingly, resulting in an increase in the amount of generated heat. The thermal stress induced by the generated heat in the optical element 80 then increases, further resulting in an increase in the amount of birefringence.

Figure 5:
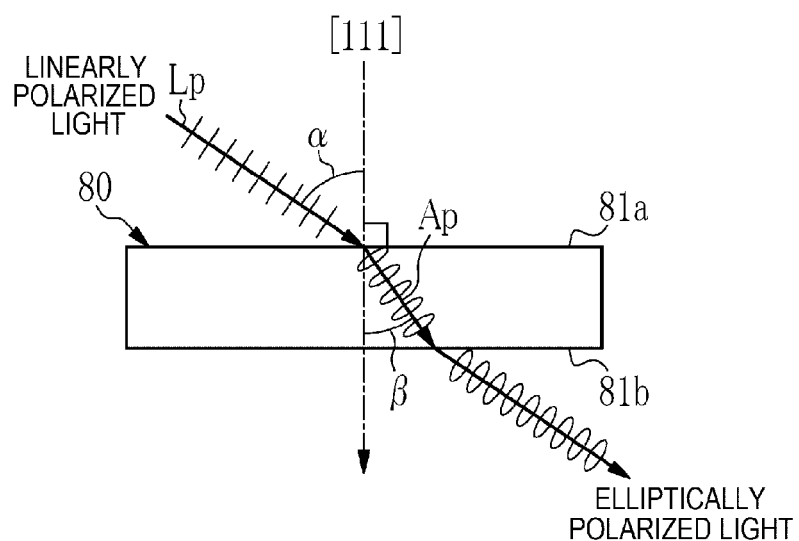
FIG. 5 describes problems with the laser apparatus 2 according to Comparative Example.

FIG. 5 shows the polarization state of the laser beam Lp in a case where the optical element 80 experiences birefringence. When the P-polarized laser beam Lp enters the optical element 80 having experienced birefringence, a phase difference is produced between linearly polarized components having polarization directions perpendicular to each other, and the linearly polarized laser beam Lp is converted by the optical element 80 into elliptically polarized light and exits out of the optical element 80. As a result, although the exposure apparatus requires a linearly polarized laser beam, the laser apparatus 2 supplies the exposure apparatus with a laser beam having a degraded degree of polarization.

Further, whenever the elliptically polarized laser beam Lp having exited out of the optical element 80 is incident on the surface of an optical element that forms another window, even when the laser beam Lp is incident thereon at Brewster's angle, the S-polarized component, which is one of the optical components of the elliptically polarized light, is reflected in accordance with Fresnel reflection, resulting in optical loss. As a result, the power of the laser beam disadvantageously decreases.

As described above, the laser apparatus 2 according to Comparative Example has the problems of degradation in the degree of polarization of the laser beam and a decrease in the power thereof. The same problem can be experienced not only by the windows of the chambers but by other optical elements provided in the laser apparatus 2 and made of the CaF$_2$ crystal, such as the beam splitters, the output coupling mirrors, the rear mirror, and the prisms.

In the laser apparatus 2 according to Comparative Example, the beam splitters, the output coupling mirrors, and the rear mirror are each so configured that the two surfaces of the plane-parallel substrate each coincide with the plane (111). The prisms are each so configured that one side surface thereof coincides with the plane (111) and the optical path axis of the laser beam coincides with the axis [111].

2. Definitions of Terms

2.1 Crystal Plane and Axis

In Comparative Example described above, the crystal plane in a cubic is expressed in the form of (hkl), and the direction of the crystal axis is expressed in the form of [uvw]. The plane and axis described above represent a specific plane and axis in the crystal. In the following description, planes equivalent to the plane (hk1), that is, planes having the same relationship with the coordinate axes are collectively referred to as {hk1}. Similarly, axes equivalent to the axis [uvw], that is, axes having the same relationship with the coordinate axes are collectively referred to as <uvw>.

When an index of the expressions described above has a negative numeral, the numeral is typically expressed with a bar thereabove, as shown in the standard projection of FIG. 3, whereas the index is preceded with the symbol "−" in the present specification, and expressed, for example, as (−111).

For example, {100} includes (100), (010), (001), (−100), (0-10), and (00-1). Further, <111> includes, for example, [111], [−111], [1-11], and [11-1].

In the following description, the angle between two axis or two planes is so expressed as to be greater than or equal to 0° but smaller than or equal to 90°.

2.2 Cutting Plane and Cutting Axis

In the following description, a plane along which a crystal is cut is referred to as a cutting plane. The axis perpendicular to the cutting plane, that is, a normal to the cutting plane is referred to as a cutting axis. For example, in a case where the axis [122] is the cutting axis in a cubic, the plane (122) is the cutting plane corresponding to the cutting axis.

2.3 Electric Field Axis

Figure 6:
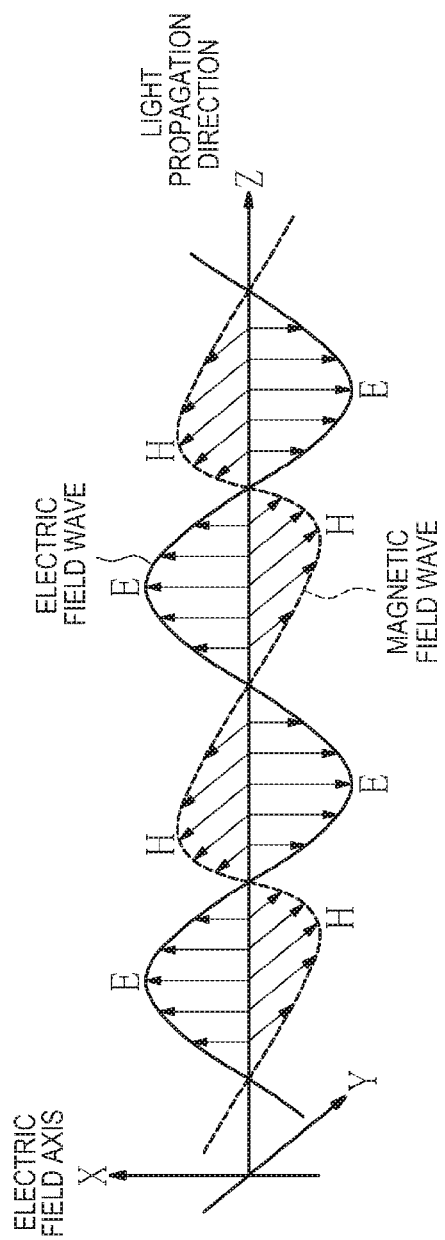
FIG. 6 shows an electric field wave and a magnetic field wave of a linearly polarized laser beam.

FIG. 6 shows an electric field wave and a magnetic field wave produced when a linearly polarized laser beam propagates in the direction Z. An electric field vector E representing the electric field wave and a magnetic field vector H representing the magnetic field wave are perpendicular to each other. The electric field vector E is parallel to the direction along the axis X. The magnetic field vector H is parallel to the direction along the axis Y. In the present specification, the axis X parallel to the electric field vector E of linearly polarized light is referred to as an electric field axis. In particular, in a case where a laser beam contains an S-polarized component in addition to a P-polarized component having a polarization direction parallel to the light incident surface of an optical element, the direction parallel to the electric field vector E of the P-polarized component is referred to as the electric field axis.

3. First Embodiment

A laser apparatus according to a first embodiment of the present disclosure will next be described. The laser apparatus according to the first embodiment has the same configuration as the configuration of the laser apparatus 2 according to Comparative Example except the configurations of the first and second windows 17a, 17b of the chamber 11 and the first and second windows 34a, 34b of the chamber 31.

3.1 Configuration and Effects

Figure 7:
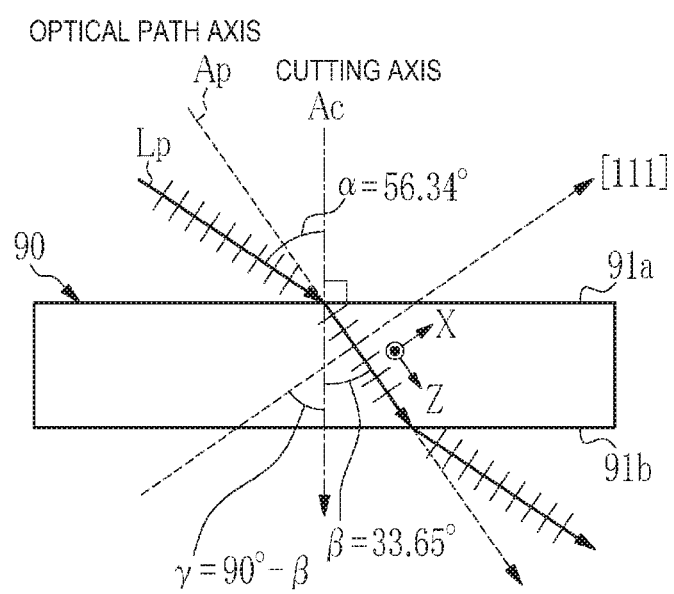
FIG. 7 is a cross-sectional view of an optical element 90 according to a first embodiment.

In the first embodiment, a description will be made on an optical element 90, which forms each of the first and second windows 17a, 17b and the first and second windows 34a, 34b. FIG. 7 is a cross-sectional view of the optical element 90 according to the first embodiment. The optical element 90 is a plane-parallel substrate made of the $CaF_2$ crystal and has a first flat surface 91a and a second flat surface 91b parallel to each other. The parallelism between the first flat surface 91a and the second flat surface 91b is preferably smaller than or equal to 0.1°, more preferably smaller than or equal to 0.0014°.

The optical element 90 is so formed that the optical path axis Ap of the laser beam Lp that propagates through the interior of the optical element 90 is perpendicular to the axis [111] of the $CaF_2$ crystal. The first flat surface 91a and the second flat surface 91b are each a cutting plane along which the $CaF_2$ crystal is cut based on a cutting axis Ac that inclines with respect to the axis [111] by an angle that roughly coincides with an angle γ, which satisfies the following Expression (3):

$$\gamma = 90° - \beta \quad (3)$$

where β represents the angle of refraction of the laser beam Lp incident on the optical element 90.

That is, the angle between the cutting axis Ac and the optical path axis Ap coincides with the angle of refraction β. The angle of incidence α of the laser beam Lp is roughly equal to Brewster's angle $\theta_B$, as in Comparative Example. Assuming that the refractive index n of the $CaF_2$ crystal is 1.501958, Brewster's angle $\theta_B$ is calculated to be about 56.34° based on Expression (1) described above. In this case, the angle of refraction β is calculated to be about 33.65° based on Expression (2) described above. The angle of incidence α is preferably 56.34±5°, within which Brewster's angle $\theta_B$ falls. Further, in this case, the angle γ between the cutting axis Ac described above and the axis [111] is preferably 56.35±5°.

The optical element 90 is so disposed that the laser beam Lp is incident as P-polarized light on the first flat surface 91a with the light incident plane being the plane containing the axis [111] and the cutting axis Ac, which is a normal to the first flat surface 91a. The electric field axis of the laser beam Lp, which is refracted at the first flat surface 91a at the angle of refraction β and propagates in the direction Z through the interior of the optical element 90, that is, the axis X therefore coincides with the axis [111]. The laser beam Lp may contain the S-polarized component in addition to the P-polarized component, which has a polarization direction parallel to the light incident surface of the optical element 90. The optical element 90 only needs to be so disposed that the electric field axis of the P-polarized component of the laser beam Lp coincides with the axis [111]. The condition in which the electric field axis of the P-polarized component of the laser beam Lp coincides with the axis [111] in the description is equivalent, for example, to a condition in which the angle between the electric field axis and the axis [111] is smaller than or equal to 5°.

Figure 8:
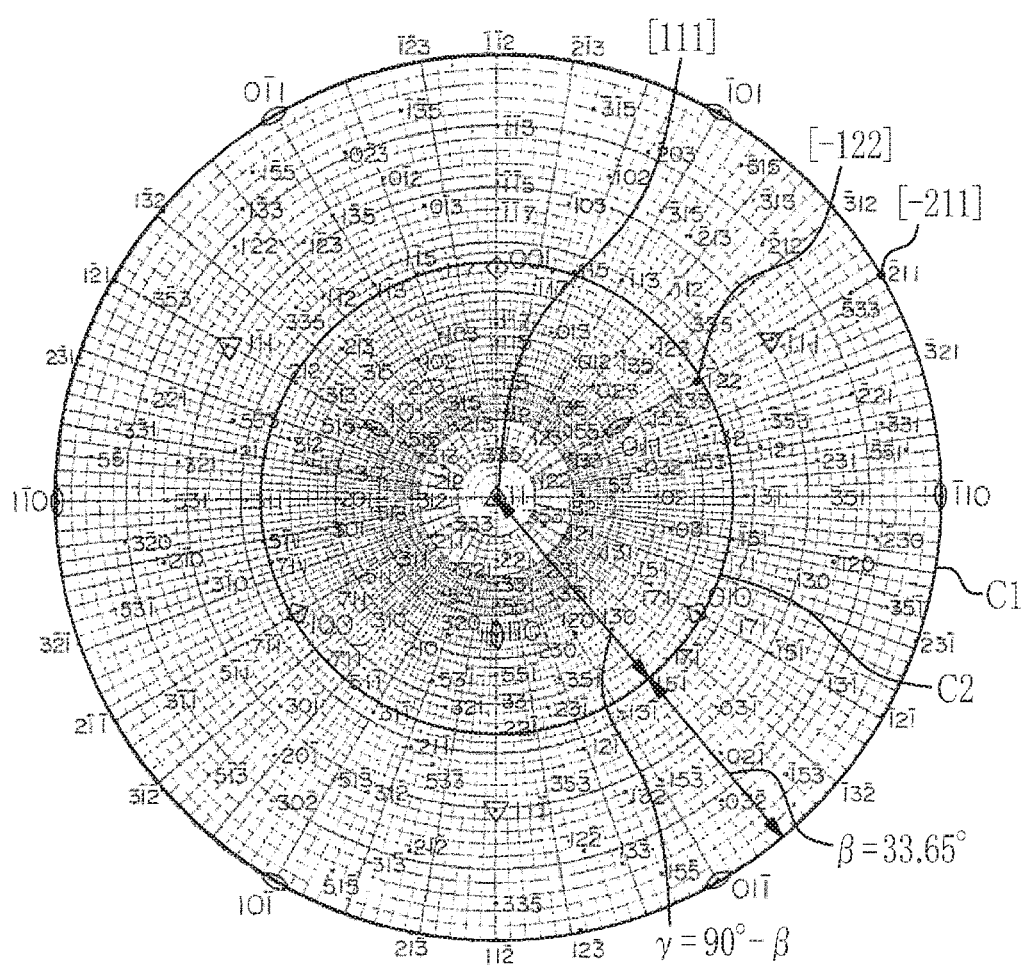
FIG. 8 is a standard (111) projection of a cubic according to the first embodiment.

FIG. 8 is a standard (111) projection of a cubic corresponding to the structure of the $CaF_2$ crystal. In FIG. 8, an axis perpendicular to the axis [111] is located on a first circumference C1, which is the outermost circumference in the standard projection. A second circumference C2 shown in FIG. 8 contains an axis that inclines with respect to an axis contained in the first circumference C1 by the angle of refraction β.

To manufacture the optical element 90 by using the $CaF_2$ crystal, the optical path axis Ap may be selected from the axes contained in the first circumference C1, and the cutting axis Ac corresponding to the optical path axis Ap may be selected from the axes contained in the second circumference C2. The $CaF_2$ crystal may then be cut based on the selected cutting axis Ac to form the first flat surface 91a and the second flat surface 91b. The cutting axis Ac may be an axis that inclines with respect to the optical path axis Ap by the angle β and is selected from the axes contained in the second circumference C2 or located in the vicinity of the second circumference C2.

For example, the axis [−211] can be selected as the optical path axis Ap from the axes contained in the first circumference C1, and the axis [−122] can be selected as the cutting axis Ac from the crystal axes contained in the second circumference C2±5°. In this case, the plane (–122) is the cutting plane for forming the first flat surface 91a and the second flat surface 91b.

3.2 Advantages

Figure 9A:
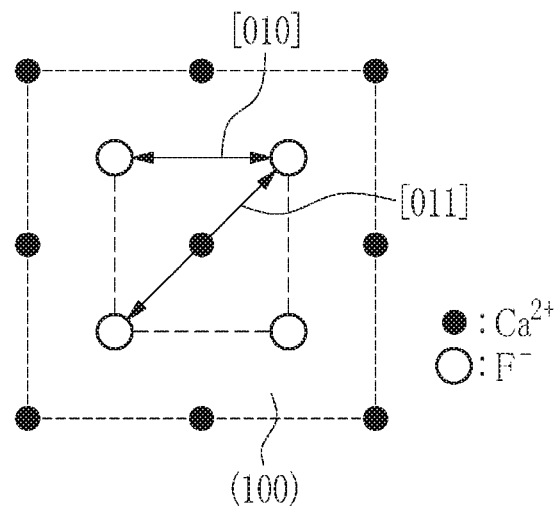
FIG. 9A shows the $CaF_2$ crystal viewed from the plane (100).
Figure 9B:
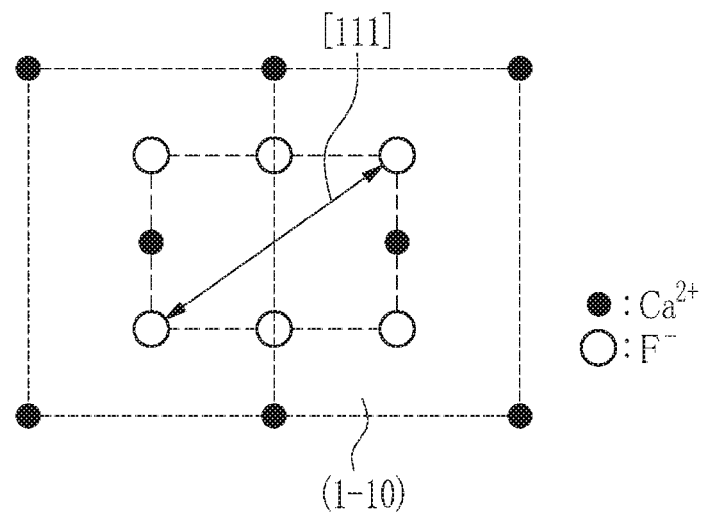
FIG. 9B shows the $CaF_2$ crystal viewed from the plane (1-10).

It is inferred that forming the optical element 90 in such a way that the electric field axis of the laser beam Lp that propagates through the interior of the optical element 90 coincides with the axis [111] reduces the amount of laser beam Lp absorbed by the optical element 90 and therefore reduces the thermal stress and the amount of birefringence as compared with Comparative Example. The inference described above is based on the fact that the inter-atom distance between the fluorine ions is maximized along the axis [111] and the direction equivalent thereto in the $CaF_2$ crystal, as shown in FIGS. 9A and 9B, and that the electric field axis of the laser beam Lp coincides with the direction described above.

Since the laser apparatus undergoes the laser oscillation at a high repetition frequency and emits the laser beam Lp having the short wavelength of about 193.4 nm, the high-energy laser beam Lp enters the $CaF_2$ crystal, of which the optical element 90 is made. In the $CaF_2$ crystal, the bond between the calcium ions and the fluorine ions is cut when two-photon energy greater than the bonding energy of the calcium ions and the fluorine ions is applied. In this case, the fluorine ions are so excited as to form dimers (Vk centers) of the fluorine ions, so that crystal defects are created in the $CaF_2$ crystal. As a result, the optical element 90 is degraded due to an increase in the optical absorptance.

It is inferred in the first embodiment that the formation of the fluorine ion dimers is suppressed when the electric field axis of the laser beam Lp, which is the direction in which the photon energy acts, coincides with the axis [111], along which the inter-atom distance between the fluorine ions is maximized. As described above, it is inferred that suppressing the formation of the fluorine ion dimers, which each serve as a degradation origin, reduces the amount of absorbed laser beam, resulting in reduction in the thermal stress and the amount of birefringence. As a result, in the first embodiment, the degradation in the degree of polarization of the laser beam and the decrease in the power thereof are suppressed. Further, in the first embodiment, suppression of the degradation of the $CaF_2$ crystal improves the durability of the windows.

Figure 10:
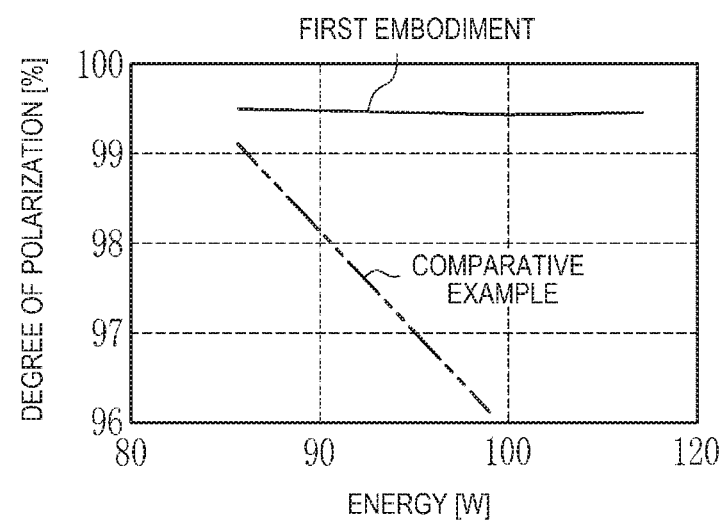
FIG. 10 shows graphs illustrating a result of evaluation of the relationship between the power of the laser beam and the degree of polarization thereof in the first embodiment and Comparative Example.

FIG. 10 shows a result of evaluation of the relationship between the power of the laser beam and the degree of polarization thereof in the first embodiment and Comparative Example. The degree of polarization is an index representing the degree of linear polarization of the laser beam emitted from the laser apparatus. The degree of polarization nearer to 100% means the higher degree of linear polarization. In the laser apparatus according to Comparative Example, an increase in the power of the laser beam caused degradation in the degree of polarization of the laser beam, whereas a high degree of polarization was maintained even when the power of the laser beam increased in the laser apparatus according to the first embodiment, as shown in FIG. 10.

Figure 11:
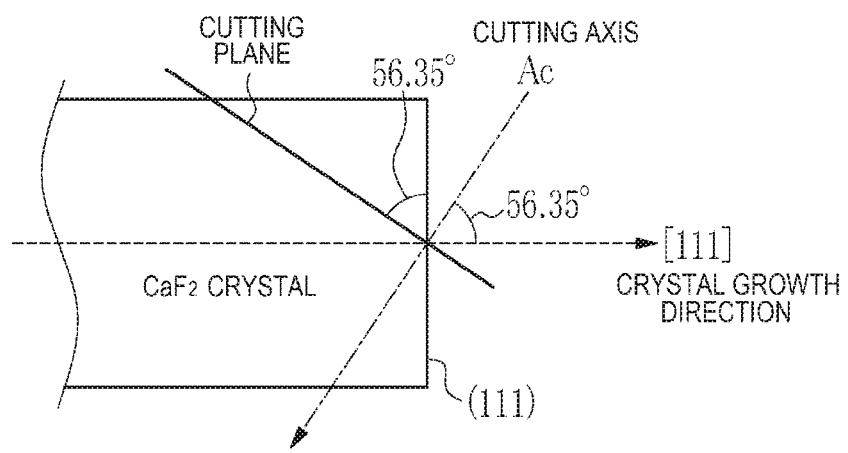
FIG. 11 describes a manufacturing problem with the optical element according to the first embodiment.

In the first embodiment, the angle between the axis [111], which is the direction in which the $CaF_2$ crystal grows, and the cutting axis Ac is as large as 56.35°, as shown in FIG. 11. The angle between the cutting plane and the plane (111) of the $CaF_2$ crystal is therefore as large as 56.35°, resulting in a problem of productivity of the optical element 90.

4. Second Embodiment

A laser apparatus according to a second embodiment of the present disclosure will next be described. The laser apparatus according to the second embodiment has the same configuration as the configuration of the laser apparatus according to the first embodiment except the configurations of the first and second windows 17a, 17b of the chamber 11 and the first and second windows 34a, 34b of the chamber 31.

4.1 Configuration and Effects

Figure 12:
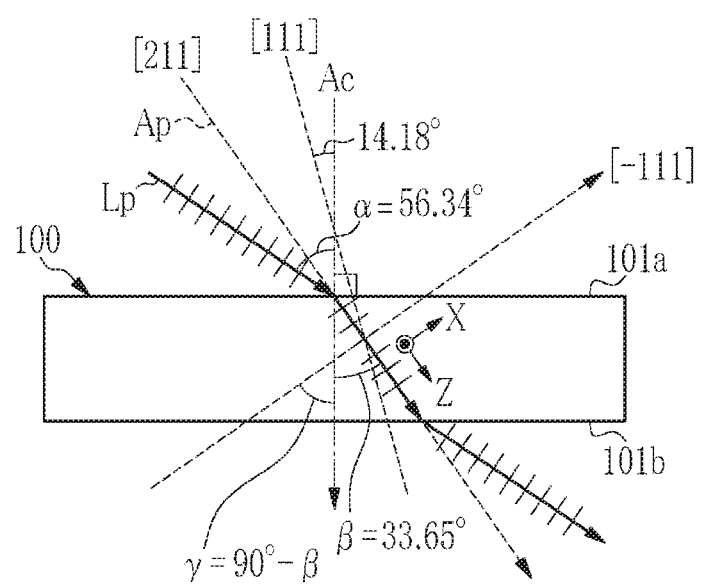
FIG. 12 is a cross-sectional view of an optical element 100 according to a second embodiment.

In the second embodiment, a description will be made on an optical element 100, which forms each of the first and second windows 17a, 17b and the first and second windows 34a, 34b. FIG. 12 is a cross-sectional view of the optical element 100 according to the second embodiment. The optical element 100 is a plane-parallel substrate made of the $CaF_2$ crystal and has a first flat surface 101a and a second flat surface 101b parallel to each other. The parallelism between the first flat surface 101a and the second flat surface 101b is preferably smaller than or equal to 0.1°, more preferably smaller than or equal to 0.0014°.

The optical element 100 is so formed that the optical path axis Ap of the laser beam Lp that propagates through the interior of the optical element 100 is perpendicular to the axis [–111] of the $CaF_2$ crystal. [–111] is equivalent to [111] in terms of direction. The electric field axis of the laser beam Lp that propagates through the interior of the optical element 100 coincides with the axis [–111], and the angle between the two axes is smaller than or equal to 5°. The other configuration of the optical element 100 is the same as that of the optical element 90 according to the first embodiment.

Figure 13:
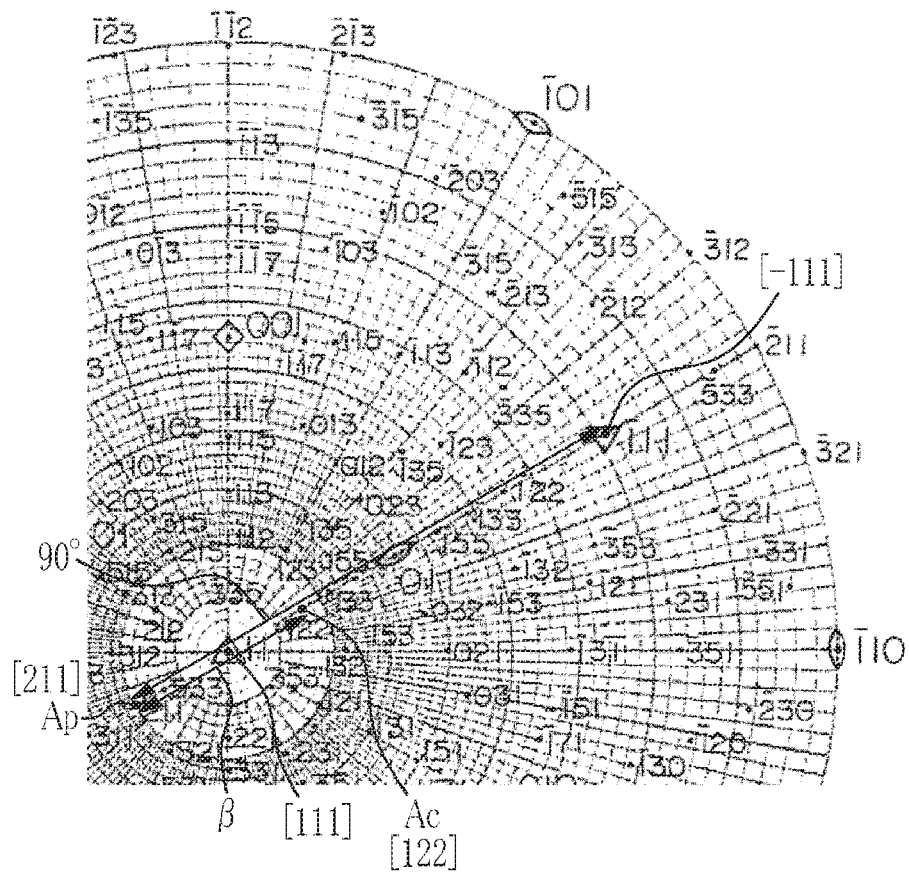
FIG. 13 is a standard (111) projection of a cubic according to the second embodiment.

Specifically, in the second embodiment, the optical path axis Ap is caused to coincide with the axis [211], which inclines with respect to the axis [–111] by 90°, as shown in FIGS. 12 and 13. The cutting axis Ac is the axis [122], which is an axis that inclines with respect to the axis [211] toward the axis [–111] by the angle of refraction β±5°. The angle of refraction β is 33.65°, as in the first embodiment. The first flat surface 101a and the second flat surface 101b are each the plane (122) along which the $CaF_2$ crystal is cut based on the cutting axis Ac.

Since the angle between the axis [–111] and the axis [111] is 70.53°, the angle between the axis [111] and the cutting axis Ac is calculated to be 14.18°.

4.2 Method for Manufacturing Optical Element

Figure 14:
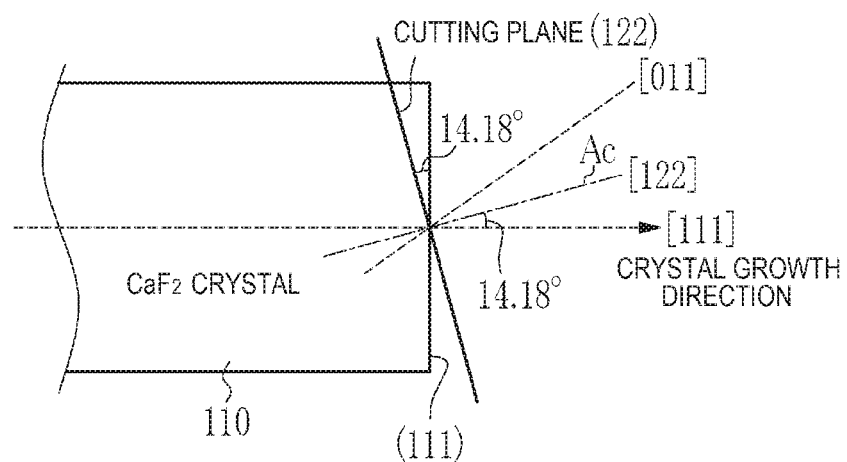
FIG. 14 describes a method for manufacturing the optical element 100.

A method for manufacturing the optical element 100 will next be described. First, a seed $CaF_2$ crystal having a (111)-plane-orientation end surface is caused to grow along the axis [111] to produce a single-crystal ingot 110, as shown in FIG. 14. An axis of the ingot 110 that inclines with respect to the axis [111] toward the axis [–111] by 14.18° is then selected as the cutting axis Ac. For example, the axis [122] is selected as the cutting axis Ax. The ingot 110 is cut with respect to the selected cutting axis Ac to form a plate-shaped, plane-parallel member having two surfaces along which the ingot 110 is cut and which the cutting axis Ac intersects as a normal. The cutting planes are each, for example, the plane (122). The thus formed plate-shaped member is then so cut as to have an appropriate size, and the two surfaces of the cut plate-shaped member is polished and otherwise processed. The optical element 100 is thus completed. The optical element 100 is then attached as each of the windows to the chamber.

4.3 Advantages

As described above, in the second embodiment, in which the optical path axis Ap of the laser beam Lp is so set as to be perpendicular to the axis [–111], the angle of the cutting planes with respect to the plane (111), which coincides with end surfaces of the ingot 110, can be reduced to about 14.18°. The productivity of the optical element 100 is thus improved.

Figure 15:
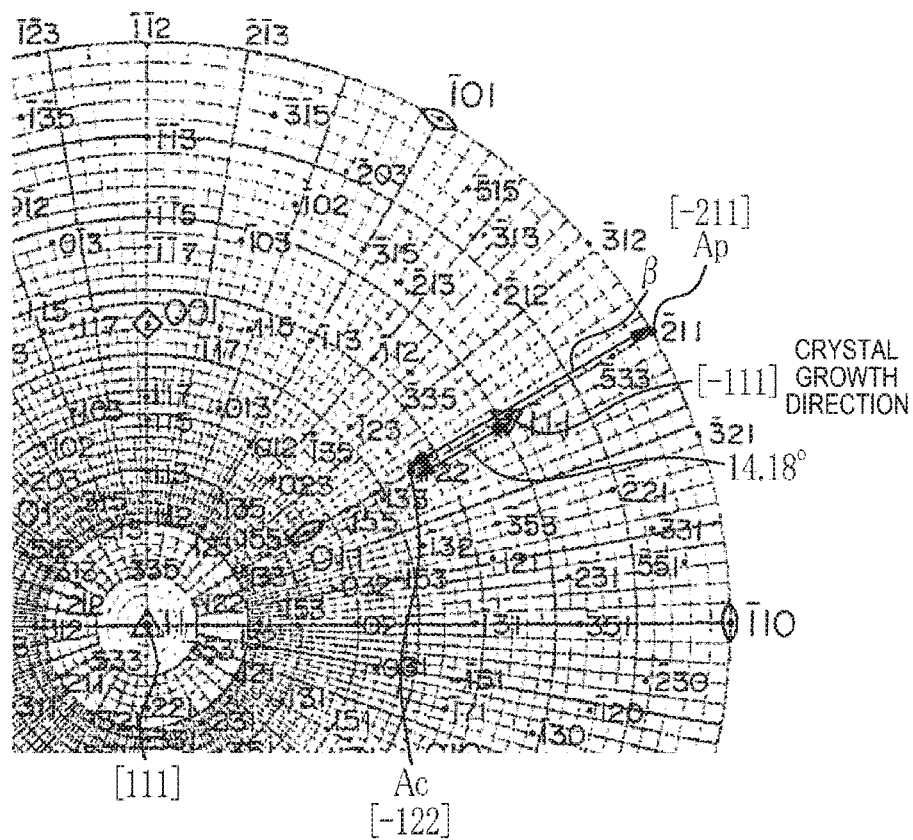
FIG. 15 describes the angle between a crystal growth direction and a cutting axis Ac in a case where the axis [−111] is used as the crystal growth direction.

In the second embodiment, in which the crystal growth direction is the direction along the axis [111], the crystal growth direction may instead be a direction equivalent to the axis [111]. For example, the axis [−111] is used as the crystal growth direction. In this case, the optical path axis Ap of the laser beam Lp is caused to coincide with the axis [−211], which is perpendicular to the axis [111] in the plane containing the axis [−111] and the axis [111], as shown in FIG. 15. A crystal axis that lies in the plane containing the axis [−111] and the axis [111] and inclines with respect to the axis [−211] by the angle of refraction β±5°, for example, the axis [−122] is selected as the cutting axis Ac. In this case, the angle between the crystal growth direction and the cutting axis Ac is as small as 14.18°, as in the second embodiment.

That is, to manufacture a high-productivity optical element 100 having a small angle between the crystal growth direction and the cutting axis Ac, a CaF$_2$ seed crystal is caused to undergo crystal growth along one axis contained in <111> to produce the ingot 110. The cutting axis Ac may then be an axis inclining by an angle smaller than or equal to 14.18° with respect to the crystal growth direction toward the direction of another axis contained in <111>, which differs from the crystal growth direction, and the ingot 110 may be cut along the plane perpendicular to the cutting axis Ac. The angle between the crystal growth direction and the cutting axis Ac may be 14.18±5°.

Further, the optical element that forms each of the first and second windows 17a, 17b and the first and second windows 34a, 34b may be so configured that the electric field axis of the P-polarized component of the laser beam incident on the optical element coincides with one axis contained in <111>. As described above, when the direction of the electric field axis of the P-polarized component of the laser beam incident on the windows of the optical element is caused to coincide with an axis other than the crystal growth direction out of the axes contained in <111> as described above, the productivity of the optical element is improved.

The optical element that forms each of the windows may be so configured that the angle between a normal to the surface on which the laser beam is incident and one axis contained in <111> is 56.35±5°. In this case, the angle between a normal to the surface on which the laser beam is incident and another axis contained in <111> is 14.18±5°.

5. Third Embodiment

A laser apparatus according to a third embodiment of the present disclosure will next be described. In the first and second embodiments, the present invention is applied to each of the windows of the chambers provided in the laser apparatus, whereas in the third embodiment, the present invention is applied to each of the beam splitters provided in the laser apparatus.

5.1 Configuration and Effects

Figure 16:
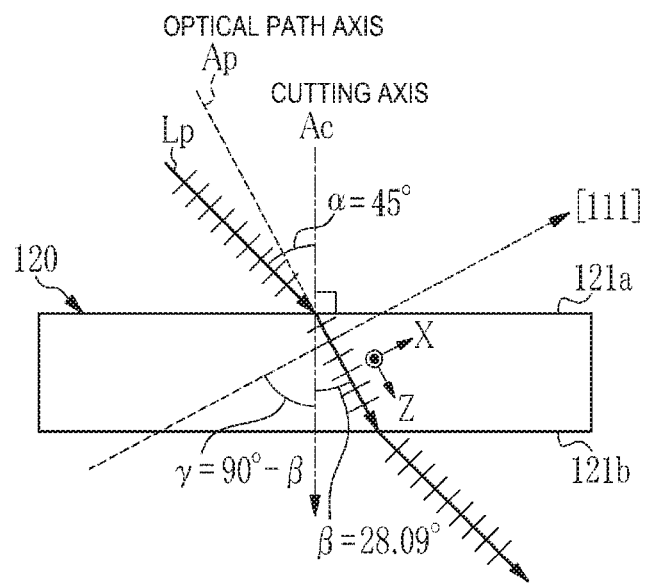
FIG. 16 is a cross-sectional view of an optical element 120 according to a third embodiment.

In the third embodiment, a description will be made on an optical element 120, which forms each of the beam splitter 21 in the power monitor 20, the beam splitter 51 in the optical pulse stretcher 50, and the first and second beam splitters 61, 62 in the monitor module 60. FIG. 16 is a cross-sectional view of the optical element 120 according to the third embodiment. The optical element 120 is a plane-parallel substrate made of the CaF$_2$ crystal and has a first flat surface 121a and a second flat surface 121b parallel to each other. The parallelism between the first flat surface 121a and the second flat surface 121b is preferably smaller than or equal to 0.1°, more preferably smaller than or equal to 0.0014°.

The optical element 120 is so disposed that the angle of incidence α of the laser beam Lp is 45°. In this case, the angle of refraction β of the laser beam Lp is calculated to be 28.09° based on Expression (2) described above. The angle of incidence α is preferably 45±5°.

Further, the optical element 120 is so formed that the optical path axis Ap of the laser beam Lp that propagates through the interior of the optical element 120 is perpendicular to the axis [111] of the CaF$_2$ crystal. The first flat surface 121a and the second flat surface 121b are each a cutting plane along which the CaF$_2$ crystal is cut based on a cutting axis Ac that inclines with respect to the axis [111] by an angle that roughly coincides with the angle γ, which satisfies Expression (3) described above. The angle γ is 61.91°.

Further, the optical element 120 is so disposed that the laser beam Lp is incident as P-polarized light on the first flat surface 121a with the light incident plane being the plane containing the axis [111] and the cutting axis Ac, which is a normal to the first flat surface 121a. The electric field axis of the laser beam Lp, which is refracted at the first flat surface 121a at the angle of refraction β and propagates through the interior of the optical element 120, therefore coincides with the axis [111]. The condition in which the electric field axis of the laser beam Lp coincides with the axis [111] in the description refers to a condition in which the angle between the electric field axis and the axis [111] is smaller than or equal to 5°.

Figure 17:
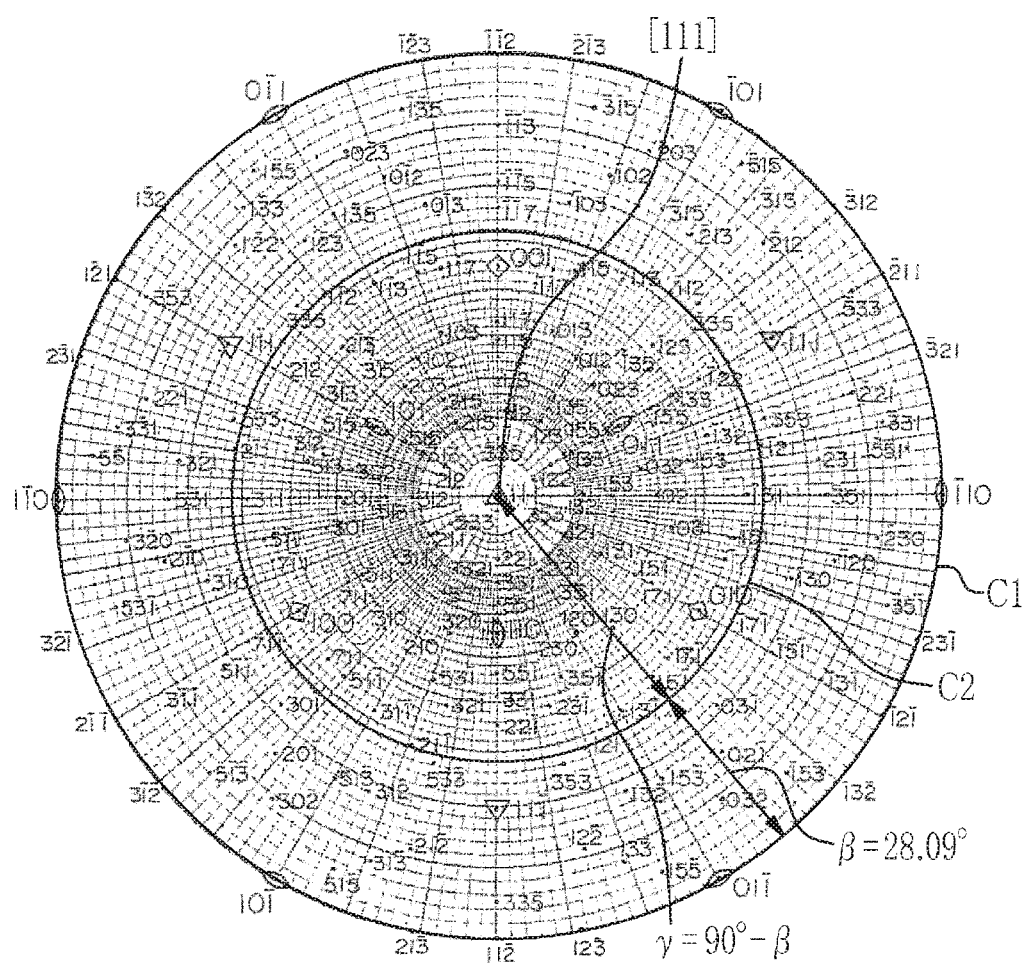
FIG. 17 is a standard (111) projection of a cubic according to the third embodiment.

FIG. 17 is a standard (111) projection of a cubic. In FIG. 17, an axis perpendicular to the axis [111] is located on the first circumference C1, which is the outermost circumference in the standard projection. The second circumference C2 shown in FIG. 17 contains an axis that inclines with respect to an axis contained in the first circumference C1 by the angle of refraction β.

To manufacture the optical element 120 by using the CaF$_2$ crystal, the optical path axis Ap may be selected from the axes contained in the first circumference C1, and the cutting axis Ac corresponding to the optical path axis Ap may be selected from the axes contained in the second circumference C2, as in the case of the optical element 90 in the first embodiment. The CaF$_2$ crystal may then be cut based on the selected cutting axis Ac to form the first flat surface 121a and the second flat surface 121b. The cutting axis Ac may be selected from the axes contained in the second circumference C2±5°, which contains axes that incline with respect to the optical path axis Ap by the angle β.

5.2 Advantages

It is inferred that forming the optical element 120 in such a way that the electric field axis of the laser beam Lp that propagates through the interior of the optical element 120 coincides with the axis [111] reduces the amount of laser beam Lp absorbed by the optical element 120 and therefore reduces the thermal stress and the amount of birefringence, as in the optical element 90 according to the first embodiment. As a result, the degradation in the degree of polarization of the laser beam and the decrease in the power thereof are suppressed, as in the first embodiment. Further, the durability of the beam splitters is improved.

The optical element 120 may be so configured that the electric field axis of the P-polarized component of the laser beam Lp coincides with one axis contained in <111>, as in the second embodiment. It is further preferable that the optical element 120 is so configured that the electric field axis of the P-polarized component of the laser beam Lp coincides with an axis contained in <111> but different from the crystal growth direction. In this case, the angle between the crystal growth direction and the cutting axis Ac is as small as 8.61°, which improves the productivity of the optical element 120. The angle between the crystal growth direction and the cutting axis Ac may be 8.61±5°.

The optical element that forms each of the beam splitters may be so configured that the angle between a normal to the surface on which the laser beam is incident and one axis contained in <111> is 61.91±5°. In this case, the angle between a normal to the surface on which the laser beam is incident and another axis contained in <111> is 8.61±5°.

6. Fourth Embodiment

A laser apparatus according to a fourth embodiment of the present disclosure will next be described. In the fourth embodiment, the present invention is applied to the output coupling mirrors and the rear mirror provided in the laser apparatus.

6.1 Configuration and Effects

Figure 18:
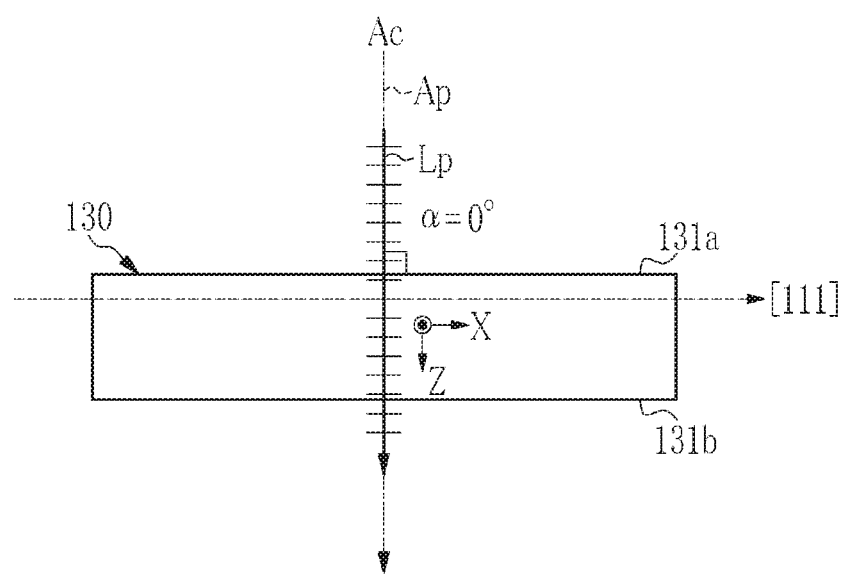
FIG. 18 is a cross-sectional view of an optical element 130 according to a fourth embodiment.

In the fourth embodiment, a description will be made on an optical element 130, which forms each of the output coupling mirror 12 in the master oscillator 10 and the output coupling mirror 32 and the rear mirror 33 in the power oscillator 30. FIG. 18 is a cross-sectional view of the optical element 130 according to the fourth embodiment. The optical element 130 is a plane-parallel substrate made of the CaF$_2$ crystal and has a first flat surface 131a and a second flat surface 131b parallel to each other. The parallelism between the first flat surface 131a and the second flat surface 131b is preferably smaller than or equal to 0.1°, more preferably smaller than or equal to 0.0014°.

The optical element 130 is so disposed that the angle of incidence α of the laser beam Lp is about 0°, that is, the laser beam Lp is incident on the first flat surface 131a at right angles. The optical path axis Ap of the laser beam Lp is therefore perpendicular to the first flat surface 131a and the second flat surface 131b. Further, the optical element 130 is so formed that the optical path axis Ap is perpendicular to the axis [111] of the CaF$_2$ crystal. The first flat surface 131a and the second flat surface 131b are each a cutting plane along which the CaF$_2$ crystal is cut based on a cutting axis Ac that inclines with respect to the axis [111] by an angle of 90°. That is, it is preferable that the first flat surface 131a and the second flat surface 131b are parallel to the axis [111], and that the parallelism between the two surfaces is preferably smaller than or equal to 5°.

Further, the optical element 130 is so disposed that the polarization direction of the laser beam Lp, which is linearly polarized light, that is, the electric field axis of the laser beam Lp is parallel to the plane containing the axis [111] and the cutting axis Ac, which is a normal to the first flat surface 131a. The electric field axis of the laser beam Lp, which propagates through the interior of the optical element 130, therefore coincides with the axis [111]. The laser beam Lp contains another linearly polarized component in some cases. The optical element 130 may be so disposed that the electric field axis of a maximum-amount polarized component of the laser beam Lp coincides with the axis [111].

Figure 19:
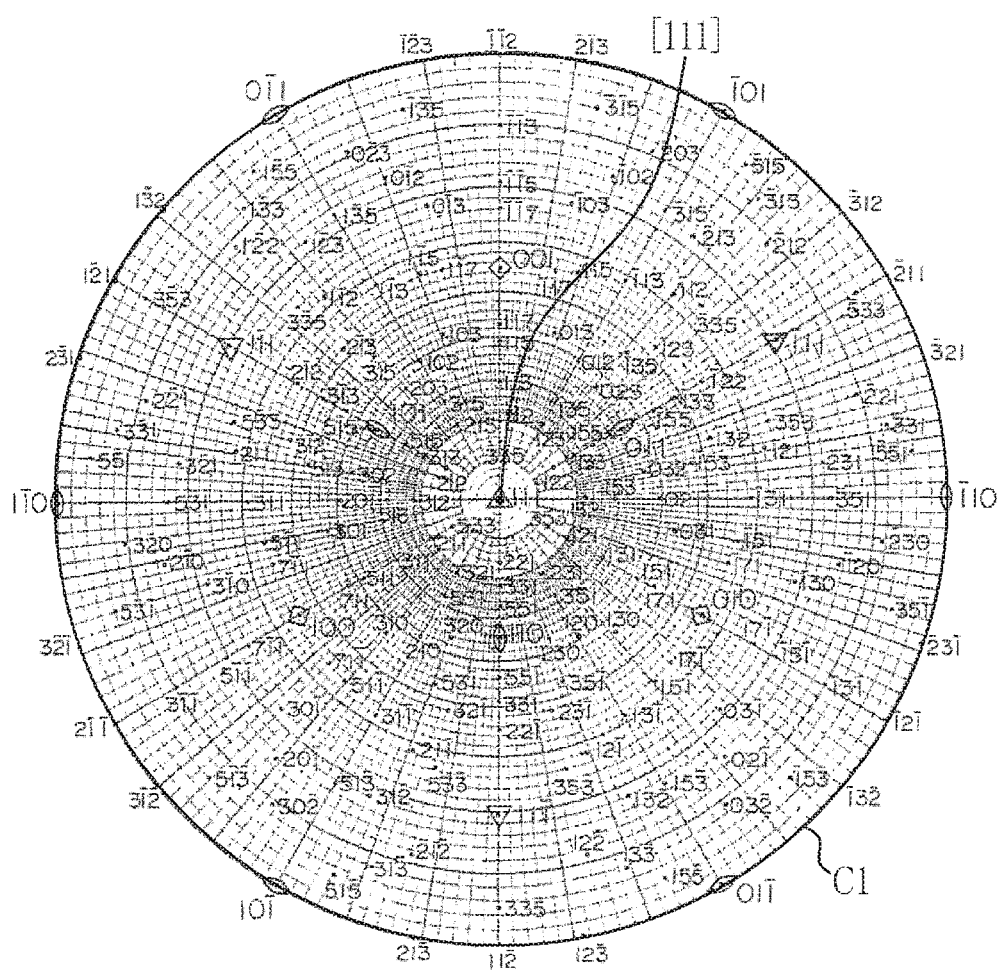
FIG. 19 is a standard (111) projection of a cubic according to the fourth embodiment.

FIG. 19 is a standard (111) projection of a cubic. In FIG. 19, an axis perpendicular to the axis [111] is located on the first circumference C1, which is the outermost circumference in the standard projection. To manufacture the optical element 130 by using the CaF$_2$ crystal, the optical path axis Ap is selected from the axes contained in the first circumference C1, and the selected optical path axis Ap is used as the cutting axis Ac. The CaF$_2$ crystal may then be cut based on the cutting axis Ac to form the first flat surface 131a and the second flat surface 131b. In the present embodiment, the optical path axis Ap is selected from the axes contained in the first circumference C1, but the optical path axis Ap is not limited to an axis contained in the first circumference C1. For example, the optical path axis Ap may instead be selected from the axes contained in the first circumference C1±5°.

6.2 Advantages

It is inferred that forming the optical element 130 in such a way that the electric field axis of the laser beam Lp that propagates through the interior of the optical element 130 coincides with the axis [111] reduces the amount of laser beam Lp absorbed by the optical element 130 and therefore reduces the thermal stress and the amount of birefringence. As a result, the degradation in the degree of polarization of the laser beam and the decrease in the power thereof are suppressed. Further, the durability of the output coupling mirrors and the rear mirror is improved.

The optical element 130 may be so configured that the electric field axis of the maximum-amount polarized component of the laser beam Lp coincides with one axis contained in <111>. Further, the optical element 130 is preferably so configured that the electric field axis of the maximum-amount polarized component of the laser beam Lp coincides with an axis contained in <111> but different from the crystal growth direction. In this case, the angle between the crystal growth direction and the cutting axis Ac is as small as 19.47°, which improves the productivity of the optical element 130.

The optical element that forms each of the output coupling mirrors and the rear mirror may be so configured that the angle between a normal to the surface on which the laser beam is incident and one axis contained in <111> is 90±5°. In this case, the angle between a normal to the surface on which the laser beam is incident and another axis contained in <111> is 19.47±5°.

7. Fifth Embodiment

A laser apparatus according to a fifth embodiment of the present disclosure will next be described. In the fifth embodiment, the present invention is applied to the prisms provided in the laser apparatus.

7.1 Configuration and Effects

Figure 20:
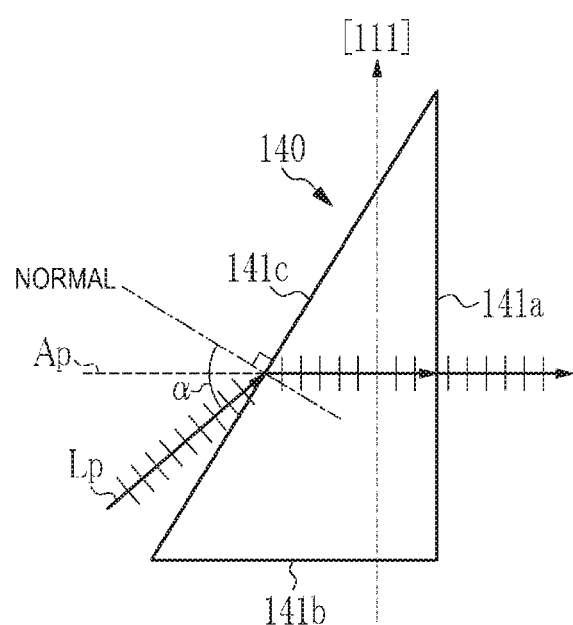
FIG. 20 is a cross-sectional view of an optical element 140 according to a fifth embodiment.

In the fifth embodiment, a description will be made on an optical element 140, which forms each of the first and second prisms 14, 15 in the line narrowing module 13 and the first and second prisms 41, 42 in the beam expander module 40. FIG. 20 is a cross-sectional view of the optical element 140 according to the fifth embodiment. The optical element 140 is a right angle prism made of the CaF$_2$ crystal and has a first side surface 141a and a second side surface 141b perpendicular to each other and an inclining surface 141c. The angle between the first side surface 141a and the second side surface 141b is, for example, 90±5°.

The optical element 140 is so disposed that the laser beam Lp is incident as P-polarized light on the inclining surface 141c at the predetermined angle of incidence α with the light incident plane being the plane containing a normal to the inclining surface 141c and the axis [111]. Further, the optical element 140 is so formed that the optical path axis Ap of the laser beam Lp that is refracted at the inclining surface 141c and propagates through the interior of the optical element 140 is incident on the first side surface 141a at an angle of incidence of 0±5°, and that the electric field axis of the laser beam Lp coincides with the axis [111]. The laser beam Lp passes through the first side surface 141a and exits out of the optical element 140. The condition in which the electric field axis of the laser beam Lp coincides with the axis [111] in the description refers to the condition in which the angle between the electric field axis and the axis [111] is smaller than or equal to 5°.

The angle between the second side surface 141b and the axis [111] is preferably, for example, 90±5°. The angle between the second side surface 141b and the axis [111] is not limited to 90±5° and only needs to fall within a range that allows an effective area of the laser beam to be ensured.

In the case where the optical element 140 is used as each of the first and second prisms 14, 15 in the line narrowing module 13, the angle of incidence α is so set as to satisfy 70°≤α≤74°. In the case where the optical element 140 is used as the first and second prisms 41, 42 in the beam expander module 40, the angle of incidence α is so set as to satisfy 54°≥α≥65°.

7.2 Advantages

It is inferred that forming the optical element 140 in such a way that the electric field axis of the laser beam Lp that propagates through the interior of the optical element 140 coincides with the axis [111] reduces the amount of laser beam Lp absorbed by the optical element 140 and therefore reduces the thermal stress and the amount of birefringence. As a result, the degradation in the degree of polarization of the laser beam and the decrease in the power thereof are suppressed. Further, the durability of the prisms is improved.

The optical element 140 may be so configured that the electric field axis of the P-polarized component of the laser beam Lp coincides with one axis contained in <111>. The optical element 140 may instead be so configured that the electric field axis of the P-polarized component of the laser beam Lp coincides with an axis contained in <111> but different from the crystal growth direction.

8. Sixth Embodiment

In the laser apparatus 2 shown in FIG. 1, the optical pulse stretcher 50 is so disposed that the laser beam incident from the beam expander module 40 on the beam splitter 51 is P-polarized light, but the optical pulse stretcher 50 is not necessarily disposed as described above. A laser apparatus according to a sixth embodiment of the present disclosure will be described below.

8.1 Configuration

Figure 21:
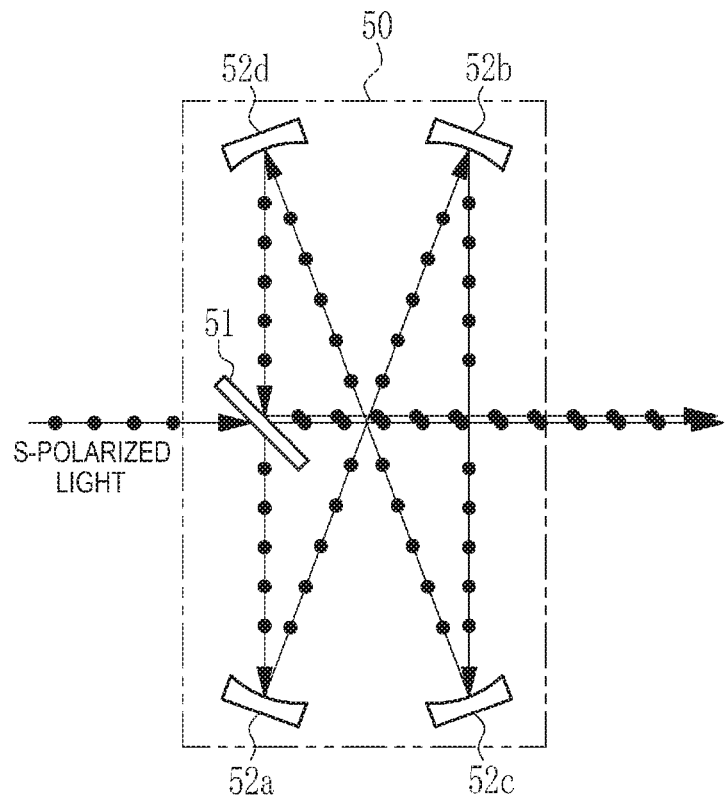
FIG. 21 describes the arrangement of an optical pulse stretcher 50 in the sixth embodiment.

FIG. 21 shows an example in which the optical pulse stretcher 50 is so disposed that the laser beam incident from the beam expander module 40 on the beam splitter 51 is S-polarized light. That is, in the first embodiment, the optical pulse stretcher 50 is so disposed that the plane containing the delay optical path is parallel to the plane containing the plane of view of FIG. 1, whereas in the sixth embodiment, the optical pulse stretcher 50 is so disposed that the plane containing the delay optical path is perpendicular to the plane containing the plane of view of FIG. 1.

Figure 22:
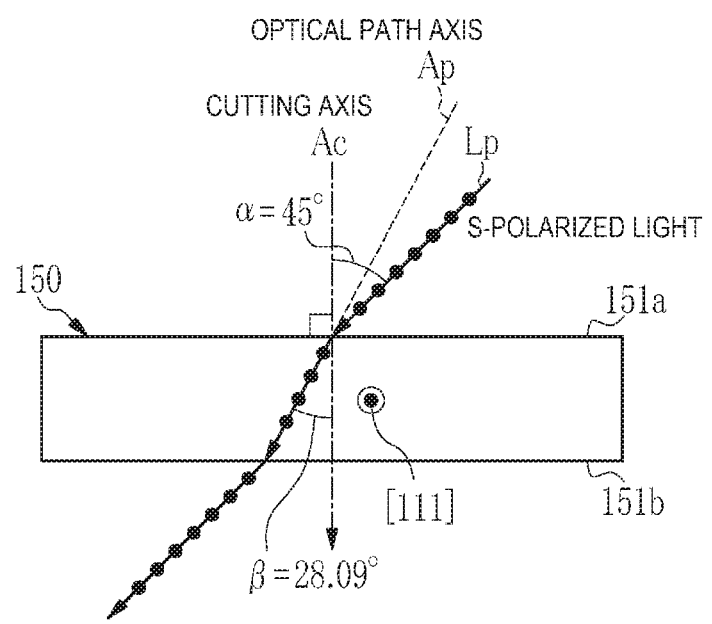
FIG. 22 is a cross-sectional view of an optical element 150 according to the sixth embodiment.

FIG. 22 is a cross-sectional view of an optical element 150 according to the sixth embodiment, which forms the beam splitter 51. The optical element 150 is a plane-parallel substrate made of the CaF$_2$ crystal and has a first flat surface 151a and a second flat surface 151b parallel to each other. The parallelism between the first flat surface 151a and the second flat surface 151b is preferably smaller than or equal to 0.1°, more preferably smaller than or equal to 0.0014°.

The optical element 150 is so disposed that the angle of incidence c of the laser beam Lp incident from the beam expander module 40 on the first flat surface 151a is 45°. In this case, the angle of refraction β of the laser beam Lp is calculated to be 28.09° based on Expression (2) described above. The angle of incidence c is preferably 45±5°.

A partial reflection film that is not shown but has a reflectance of the S-polarized laser beam ranging from 40% to 70% is formed on the first flat surface 151a of the optical element 150. A reflection suppressing film that is not shown but suppresses reflection of the S-polarized laser beam is formed on the second flat surface 151b.

The optical element 150 is so formed that the electric field axis of the laser beam Lp that propagates through the interior of the optical element 150 coincides with the axis [111] of the CaF$_2$ crystal. Since the laser beam Lp that propagates through the interior in the optical element 150 is S-polarized light with respect to the first flat surface 151a, the axis [111] is perpendicular to the plane containing the plane of view of FIG. 22. The condition in which the electric field axis of the laser beam Lp coincides with the axis [111] in the description refers to the condition in which the angle between the electric field axis and the axis [111] is smaller than or equal to 5°. That is, the first flat surface 151a and the second flat surface 151b of the optical element 150 are formed by cutting the CaF$_2$ crystal along the cutting axis Ac that is an arbitrary crystal axis that inclines with respect to the axis [111] by 90±5°.

8.2 Effects

The laser beam that enters the optical pulse stretcher 50 from the beam expander module 40 is incident as S-polarized light on the first flat surface 151a of the optical element 150, which forms the beam splitter 51. The laser beam incident on the first flat surface 151a partially passes through the optical element 150 and exits out of the optical pulse stretcher 50. Part of the laser beam incident on the first flat surface 151a is reflected and enters the delay optical path formed of the first to fourth concave mirrors 52a to 52d. The laser beam having reached the delay optical path travels along the entire delay optical path and is incident as S-polarized light on the second flat surface 151b of the optical element 150.

The laser beam incident from the delay optical path on the second flat surface 151b partially passes through the optical element 150 and enters the delay optical path again. Part of the laser beam incident on the second flat surface 151b is reflected and outputted as a delayed laser beam from the optical pulse stretcher 50. A laser beam having an increased pulse width is thus outputted from the optical pulse stretcher 50.

8.3 Advantages

In the sixth embodiment, in which the laser beam is incident as S-polarized light on each of the first flat surface 151a and the second flat surface 151b of the optical element 150, which forms the beam splitter 51, the electric field axis of the laser beam that propagates through the interior of the optical element 150 coincides with the axis [111]. The optical element 150 thus allows reduction in the amount of absorbed laser beam and suppression of degradation of the optical element, as in the embodiments described above.

Further, forming a partial reflection film configured to partially reflect S-polarized light on the first flat surface 151a of the optical element 150 and forming a reflection suppressing film on the second flat surface 151b of the optical element 150 improve the pulse stretching efficiency of the optical pulse stretcher 50.

The laser beam Lp that enters the optical element 150 contains the P-polarized component as well as the S-polarized component with respect to the first flat surface 151*a* in some cases. The optical element 150 may be so disposed that the electric field axis of the S-polarized component of the laser beam Lp coincides with one axis contained in <111>. It is also preferable that the optical element 150 is instead so configured that the electric field axis of the S-polarized component of the laser beam Lp coincides with an axis contained in <111> but different from the crystal growth direction.

In the sixth embodiment, the optical element that forms the beam splitter is so configured that the laser beam incident on the beam splitter is S-polarized light, but not necessarily, and the optical element that forms the windows of the chamber may be so configured that the laser beam incident on the windows is S-polarized light. In this case, the optical element that forms each of the windows may be a plane-parallel substrate made of the $CaF_2$ crystal and so configured that a normal to the first and second surfaces parallel to each other is perpendicular to the axis [111], as in the optical element 150 shown in FIG. 22. A reflection suppressing film configured to suppress reflection of the S-polarized laser light is preferably formed on each of the first and second surfaces.

In this case, the laser beam incident as S-polarized light on the first and second surfaces of the optical element that forms each of the windows passes through the window in the state in which the electric field axis coincides with the axis [111], whereby the optical element allows reduction in the amount of absorbed laser beam and suppression of degradation of the optical element, as in the embodiments described above. The optical element that forms each of the windows may be so disposed that the electric field axis of the S-polarized component of the laser beam Lp coincides with one axis contained in <111>.

9. Seventh Embodiment

In the laser apparatus 2 shown in FIG. 1, the prisms in the line narrowing module 13 and the beam expander module 40 are each so disposed that the laser beam incident on the prism is P-polarized light, but the prisms are not necessarily disposed as described above. A laser apparatus according to a seventh embodiment of the present disclosure will be described below.

9.1 Configuration and Effects

Figure 23:
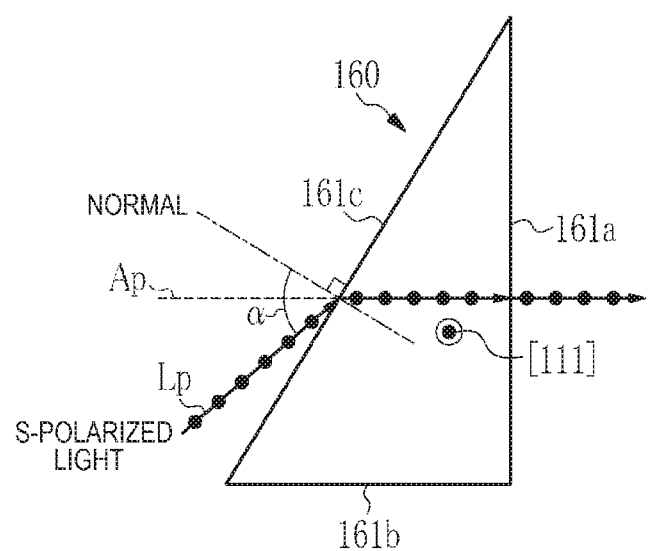
FIG. 23 is a cross-sectional view of an optical element 160 according to a seventh embodiment.

In the seventh embodiment, the prisms in the line narrowing module 13 and the beam expander module 40 are each so disposed that the direction in which the diameter of the laser beam is increased is perpendicular to the plane containing the plane of view of FIG. 1. FIG. 23 is a cross-sectional view of an optical element 160, which forms each of the prisms in the line narrowing module 13 and the beam expander module 40. The optical element 160 is a right angle prism made of the $CaF_2$ crystal and has a first side surface 161*a* and a second side surface 161*b* perpendicular to each other and an inclining surface 161*c*. The angle between the first side surface 161*a* and the second side surface 161*b* is, for example, 90±5°.

The optical element 160 is so disposed that the laser beam Lp is incident as S-polarized light on the inclining surface 161*c* at the predetermined angle of incidence α. Further, the optical element 160 is so formed that the optical path axis Ap of the laser beam Lp that is refracted at the inclining surface 161*c* and propagates through the interior of the optical element 160 is incident on the first side surface 161*a* at the angle of incidence of 0±5°. A reflection suppressing film that is not shown but suppresses reflection of the S-polarized laser beam is formed on the inclining surface 161*c*.

The optical element 160 is so formed that the electric field axis of the laser beam Lp that propagates through the interior of the optical element 160 coincides with the axis [111]. Since the laser beam Lp that propagates through the interior of the optical element 160 is S-polarized light with respect to the first side surface 161*a*, the axis [111] is perpendicular to the plane containing the plane of view of FIG. 23. The condition in which the electric field axis of the laser beam Lp coincides with the axis [111] in the description refers to the condition in which the angle between the electric field axis and the axis [111] is smaller than or equal to 5°.

The angle between a normal to the second side surface 161*b* and the axis [111] is preferably, for example, 90±5°. The angle between a normal to the second side surface 161*b* and the axis [111] is not limited to 90±5° and only needs to fall within a range that allows an effective area of the laser beam to be ensured.

In the case where the optical element 160 is used as each of the first and second prisms 14, 15 in the line narrowing module 13, the angle of incidence α is so set as to satisfy $70° \leq α \leq 74°$. In the case where the optical element 160 is used as the first and second prisms 41, 42 in the beam expander module 40, the angle of incidence α is so set as to satisfy $54° \leq α \leq 65°$.

The laser beam Lp incident as S-polarized light on the inclining surface 161*c* of the optical element 160 passes through the interior of the optical element 160 in the state in which the electric field axis coincides with the axis [111] and exits via the first side surface 161*a* with the diameter of the laser beam increased.

9.2 Advantages

In the seventh embodiment, in which the laser beam incident as S-polarized light on the inclining surface 161*c* of the optical element 160 passes through the interior of the optical element 160 in the state in which the electric field axis coincides with the axis [111], the optical element 160 allows reduction in the amount of absorbed laser beam and suppression of degradation of the optical element, as in the embodiments described above. Further, forming the reflection suppressing film configured to suppress reflection of S-polarized light on the inclining surface 161*c* of the optical element 160 suppresses reflection loss and improves the beam diameter increasing efficiency.

The laser beam Lp that enters the optical element 160 contains the P-polarized component as well as the S-polarized component with respect to the including surface 161*c* in some cases. The optical element 160 may be so disposed that the electric field axis of the S-polarized component of the laser beam Lp coincides with one axis contained in <111>. It is also preferable that the optical element 160 is instead so configured that the electric field axis of the S-polarized component of the laser beam Lp coincides with an axis contained in <111> but different from the crystal growth direction.

As described above, according to the present invention, optimizing the relationship between the electric field axis of the laser beam and the crystal orientation of the optical element allows improvement in the absorptance of the laser beam and improvement in the durability of the optical element. Determination of the direction of the electric field axis based, for example, on the angle of incidence of the laser beam and formation of the optical element in such a way that one axis contained in <111> of the $CaF_2$ crystal coincides with the determined electric field axis only need to be performed, whereby the present invention is applicable to any optical element with no limitation on the shape of the optical element or the angle of incidence of the laser beam incident on the optical element.

The above embodiments have been described with reference to, for example, an ArF laser apparatus as the laser apparatus, but the present invention is not limited to the case described above. For example, the present invention is also applicable to an ultraviolet laser apparatus configured to emit a laser beam that belongs to a wavelength region ranging from 351 to 126 nm, such as XeF, XeCl, KrF, $F_2$, $Kr_2$, and Are laser apparatuses. That is, the wavelength of the laser beam emitted from a laser apparatus to which the present invention is applicable belongs to the wavelength region ranging from 351 nm to 126 nm.

The above description is intended not to be limiting but merely to be exemplary. It will therefore be apparent for a person skilled in the art that the embodiments of the present disclosure can be changed without departing from the accompanying claims.

The terms used in the entire specification and accompanying claims should each be construed as a "non-limiting" term. For example, the term "include" or "included" should be construed as "does not necessarily include only what is described." The term "have" should be construed as "does not necessarily have only what is described." Further, an indefinite article "a" described in the present specification and the accompanying claims should be construed as a term that means "at least one" or "one or more."

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A laser apparatus comprising:
an optical element that is made of a $CaF_2$ crystal and configured to transmit an ultraviolet laser beam obliquely incident on one surface of the optical element,
an electric field axis of a P-polarized component of the laser beam propagating through an interior of the optical element coinciding with one axis contained in <111> of the $CaF_2$ crystal, with the P-polarized component defined with respect to the one surface of the optical element.

2. The laser apparatus according to claim 1, wherein the optical element is a plane-parallel substrate.

3. The laser apparatus according to claim 2, wherein the optical element forms a window of a chamber disposed in an optical path of the laser beam.

4. The laser apparatus according to claim 2, wherein an angle of incidence of the laser beam incident on the optical element is in a range of 56.34±5°.

5. The laser apparatus according to claim 4, wherein the optical element is so configured that an angle between a normal to the surface on which the laser beam is incident and the one axis contained in <111> is in a range of 56.35±5°.

6. The laser apparatus according to claim 2, wherein the optical element forms a beam splitter disposed in the optical path of the laser beam.

7. The laser apparatus according to claim 6, wherein an angle of incidence of the laser beam incident on the optical element is in a range of 45±5°.

8. The laser apparatus according to claim 6, wherein the optical element is so configured that an angle between a normal to the surface on which the laser beam is incident and the one axis contained in <111> is in a range of 61.91±5°.

9. The laser apparatus according to claim 6, further comprising at least one of a power monitor, a monitor module, and an optical pulse stretcher, wherein the beam splitter is contained in the power monitor, the monitor module, or the optical pulse stretcher.

10. The laser apparatus according to claim 1, wherein the optical element forms a prism disposed in an optical path of the laser beam.

11. The laser apparatus according to claim 10, further comprising at least one of a beam expander module and a line narrowing module, wherein the prism is contained in at least one of the beam expander module and the line narrowing module.

12. The laser apparatus according to claim 1, wherein a wavelength of the laser beam belongs to a wavelength region ranging from 351 to 126 nm.

13. A laser apparatus comprising:
an optical element that is made of a $CaF_2$ crystal and configured to transmit an ultraviolet laser beam incident on one surface of the optical element,
an electric field axis of a maximum-amount polarized component of the laser beam propagating through an interior of the optical element coinciding with one axis contained in <111> of the $CaF_2$ crystal.

14. The laser apparatus according to claim 13, wherein the optical element forms a window of a chamber disposed in an optical path of the laser beam.

15. The laser apparatus according to claim 13, further comprising at least one of an output coupling mirror, a rear mirror, a beam splitter, and a prism, wherein the optical element forms at least one of the output coupling mirror, the rear mirror, the beam splitter, and the prism.

16. The laser apparatus according to claim 13, wherein the optical element is a plane-parallel substrate, and
the laser beam is incident on the plane-parallel substrate at right angles.

17. The laser apparatus according to claim 13, wherein the laser beam is obliquely incident on one surface of the optical element, and
the electric field axis is an electric field axis of an S-polarized component of the laser beam propagating through an interior of the optical element, the S-polarized component defined with respect to the one surface of the optical element.

* * * * *